United States Patent
Uberna et al.

(10) Patent No.: US 7,817,688 B2
(45) Date of Patent: Oct. 19, 2010

(54) PHASE AND POLARIZATION CONTROLLED BEAM COMBINING DEVICES AND METHODS

(75) Inventors: Radoslaw J. Uberna, Boulder, CO (US); Bruce G. Tiemann, Longmont, CO (US); Andrew T. Bratcher, Broomfield, CO (US)

(73) Assignee: Lockheed Martin Coherent Technologies, Inc., Louisville, CO (US)

( * ) Notice: Subject to any disclaimer, the term of this patent is extended or adjusted under 35 U.S.C. 154(b) by 43 days.

(21) Appl. No.: 12/358,205

(22) Filed: Jan. 22, 2009

(65) Prior Publication Data

US 2009/0219960 A1 Sep. 3, 2009

Related U.S. Application Data

(60) Provisional application No. 61/029,837, filed on Feb. 19, 2008, provisional application No. 61/075,712, filed on Jun. 25, 2008.

(51) Int. Cl.
*H01S 3/10* (2006.01)
(52) U.S. Cl. .......................................... 372/27; 372/20
(58) Field of Classification Search ................ 372/18, 372/97; 356/369; 385/48; 359/341.1
See application file for complete search history.

(56) References Cited

U.S. PATENT DOCUMENTS

| 4,096,448 | A | 6/1978 | Hayes |
| 4,648,092 | A | 3/1987 | Ewbank et al. |
| 4,794,345 | A | 12/1988 | Linford et al. |
| 6,275,317 | B1 | 8/2001 | Doerr et al. |
| 6,762,713 | B1 * | 7/2004 | McMillan et al. ........... 342/188 |
| 6,882,781 | B2 | 4/2005 | Ionov |
| 6,967,617 | B1 * | 11/2005 | McMillan et al. ........... 342/188 |
| 7,193,720 | B2 * | 3/2007 | Gatt ........................... 356/489 |
| 7,286,241 | B2 * | 10/2007 | Drake, Jr. ................... 356/502 |
| 2002/0054290 | A1 | 5/2002 | Vurens et al. |
| 2004/0165620 | A1 | 8/2004 | Rogers et al. |
| 2006/0078033 | A1 | 4/2006 | Betin et al. |
| 2007/0097377 | A1 | 5/2007 | Courville et al. |
| 2007/0211995 | A1 | 9/2007 | Christensen et al. |

* cited by examiner

*Primary Examiner*—Minsun Harvey
*Assistant Examiner*—Tuan N. Nguyen
(74) *Attorney, Agent, or Firm*—McDermott Will & Emery LLP

(57) ABSTRACT

A controller, such as a programmable logic controller, may manipulate a phase and/or polarization module to alter and/or control the phase and polarization of input beams. Utilizing active phase and polarization control can enable the combination of any arbitrary number of input beams into a single, combined beam. Utilizing active phase and polarization control can also enable the combination of input beams having arbitrary power levels.

18 Claims, 20 Drawing Sheets

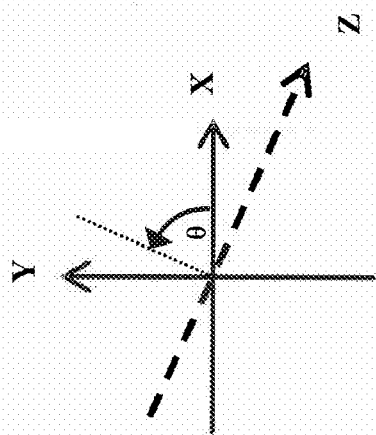
Figure 1A
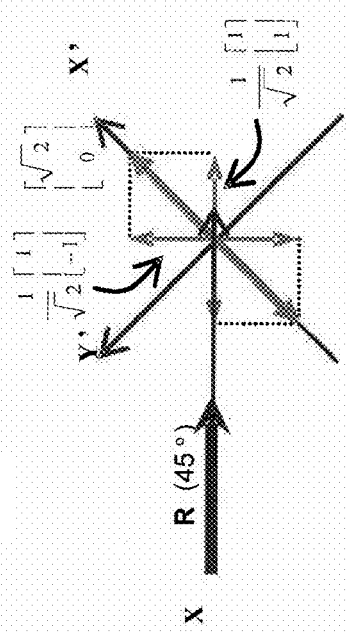
Figure 1B
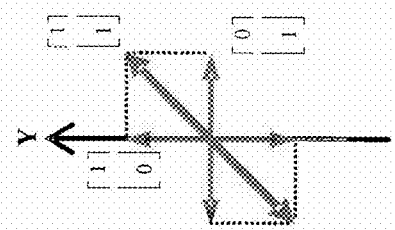

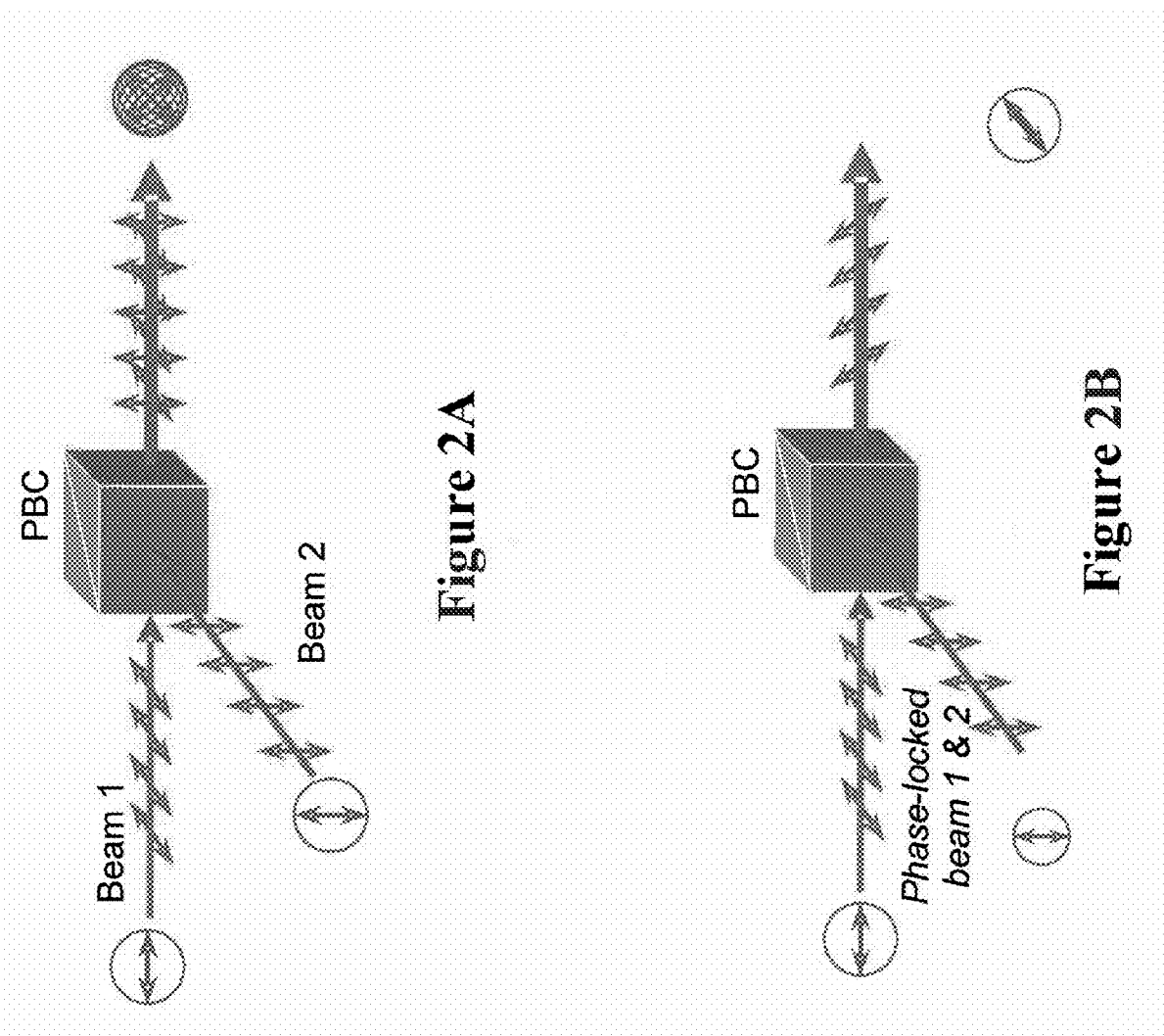

PHASE AND POLARIZATION CONTROLLED BEAM COMBINING DEVICES AND METHODS

RELATED APPLICATIONS

This application claims the benefit of U.S. Provisional Application Ser. No. 61/029,837 filed Feb. 19, 2008, entitled "Coherent Polarization Beam Combiner," the entirety of which is hereby incorporated by reference for all purposes. This application also claims the benefit of U.S. Provisional Application Ser. No. 61/075,712 filed Jun. 25, 2008, entitled "Coherent Polarization Beam Combination With Active Polarization Control For Directed Energy Applications."

STATEMENT REGARDING FEDERALLY SPONSORED RESEARCH OR DEVELOPMENT

This invention was made with Government support under Contract No. FA9451-06-D-0013/Delivery Order 0001 awarded by the U.S. Air Force. The Government has certain rights in the invention.

FIELD

The subject technology generally relates to laser beam combiners and, in particular, relates to phase and polarization controlled beam combining devices and methods.

BACKGROUND

Many technological arenas, including sensing and directed energy, are constantly pushing the limits of what is achievable from a laser system. A recurring goal in the art is to maximize (i.e., power scale) the output power of a laser beam while maintaining beam quality.

Power scaling of a laser system faces obstacles associated with the degradation of efficiency and beam quality at high output powers due to thermal effects in the lasing medium. One solution to achieve high power is to combine a number of lower-power beams into a single beam. By operating each individual lasing element at lower power, thermal degradations to beam quality and efficiency may be avoided. Many known techniques, both coherent and incoherent, are utilized to scale the power of a laser beam by combining the outputs of multiple lasing elements.

To date, free-space phased arrays incorporating multiple emitters closely packed together have been the most popular architectures for coherent combining. However, phased arrays are characterized by a non-unity fill factor, due to the fact that the individual emitters do not overlap in the near-field. Moreover, since the far-field power produced by phased arrays is partially diverted into side-lobes, their combining efficiency is limited to approximately 40-80% of power in the central lobe because of the losses to the side lobes.

Further still, it is often accepted in the art that polarization combination is not a viable candidate for power scaling because of the inherent limit of the combination to two beams. This limitation is based on the belief that polarization combination produces a statistical mixture of two orthogonal states that is unsuitable for any further combination with additional beams.

SUMMARY

In some aspects of the subject technology, phase and polarization control may be active in that a controller, such as a programmable logic controller, may manipulate a phase and/or polarization module to alter and/or control the phase and polarization of input beams. Utilizing active phase and polarization control can enable the combination of any arbitrary number of input beams into a single, combined beam. Further, certain embodiments of the subject technology may utilize active phase and polarization control to enable the combination of input beams having arbitrary power levels. Certain embodiments of the subject technology may utilize: (i) active phase control so that two beams are phase-locked in relation to each other (whether in-phase, out-of-phase, or any arbitrary phase), and (ii) polarization control (either active or passive) so that the polarization of two beams are orthogonal in relation to each other. Active polarization control may be performed with a controller, as noted above. Passive polarization control may be performed at the source of the input beam, for example, with a laser beam source. Once phase-locked and orthogonal, the beams may be combined, producing a coherent superposition with a combined beam power approaching 100% efficiency. The process of phase-locking and polarization control can be repeated and cascaded for any number of arbitrary input beams, from two input beams to any arbitrary plurality of input beams.

In accordance with an embodiment, a laser beam combining device is provided. The device includes a phase and polarization module configured to provide a plurality of laser beams that are phase-locked and pair-wise orthogonally polarized, the plurality of laser beams including at least a first laser beam and a second laser beam, the first laser beam having a first phase, the second laser beam having a second phase, the first phase and the second phase being phase locked with respect to each other, the first laser beam having a first polarization, the second laser beam having a second polarization, and the first polarization being orthogonal to the second polarization. The device also includes a controller configured to control the phase and polarization module to manipulate phase and polarization for each laser beam of the plurality of laser beams, and a first beam combiner configured to combine the first laser beam and the second laser beam and to provide an output laser beam.

In accordance with an embodiment, a laser beam combining device is provided. The device includes a first modulator in an optical path for a first laser beam, a first polarizer in the optical path for the first laser beam, a second modulator in an optical path for a second laser beam, a second polarizer in the optical path for the second laser beam, a third modulator in an optical path for a third laser beam, a third polarizer in the optical path for the third laser beam, a fourth modulator in an optical path for a fourth laser beam, a fourth polarizer in the optical path for the fourth laser beam, a first beam combiner configured to combine the first laser beam and the second laser beam and to provide a first output laser beam, a second beam combiner configured to combine the third laser beam and the fourth laser beam and to provide a second output laser beam, a third beam combiner configured to combine the first output laser beam and the second output laser beam and to provide a third output laser beam, and a controller configured to control the first modulator, the second modulator, the third modulator, and the fourth modulator, wherein the first modulator and the second modulator are configured to phase lock a phase of the first laser beam to a phase of the second laser beam, the third modulator and the fourth modulator are configured to phase lock a phase of the third laser beam to a phase of the fourth laser beam, the first polarizer and the second polarizer are configured to orthogonally polarize the first laser beam and the second laser beam, and the third polarizer and the fourth polarizer are configured to orthogonally polarize the third laser beam and the fourth laser beam.

In accordance with an embodiment, a method is provided for combining a plurality of laser beams. The method includes polarizing, on instruction from a controller, at least one of a first polarity of a first laser beam and a second polarity of a second laser beam to orthogonally polarize the first polarity and the second polarity in relation to each other, phase locking, on instruction from the controller, at least one of a first phase of the first laser beam and a second phase of the second laser beam to phase lock the first phase and the second phase with respect to the each other, and combining the first laser beam and the second laser beam to produce an output laser beam.

Additional features and advantages of the subject technology will be set forth in the description below, and in part will be apparent from the description, or may be learned by practice of the subject technology. The advantages of the subject technology will be realized and attained by the structure particularly pointed out in the written description and claims hereof as well as the appended drawings.

It is to be understood that both the foregoing general description and the following detailed description are exemplary and explanatory and are intended to provide further explanation of the subject technology as claimed.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology. The features and nature of the present disclosure will become more apparent from the detailed description set forth below when taken in conjunction with the drawings in which like reference characters identify correspondingly throughout and wherein:

FIG. 1A is an example of a right-hand coordinate (laboratory) frame that illustrates the orientation angles of polarization vectors and optical components.

FIG. 1B is an example of a right-hand coordinate (laboratory) frame that illustrates the orientation of polarization vectors and optical components as effected by rotation of the coordinate frame on Jones vectors.

FIG. 2A is an illustrative example showing the combination of two linearly polarized beams with uncontrolled phase relationships.

FIG. 2B is an illustrative example showing the combination of two linearly polarized beams having orthogonal polarizations with phases locked in relation to each other, in accordance with an aspect of the subject technology.

DETAILED DESCRIPTION

Figure 3:
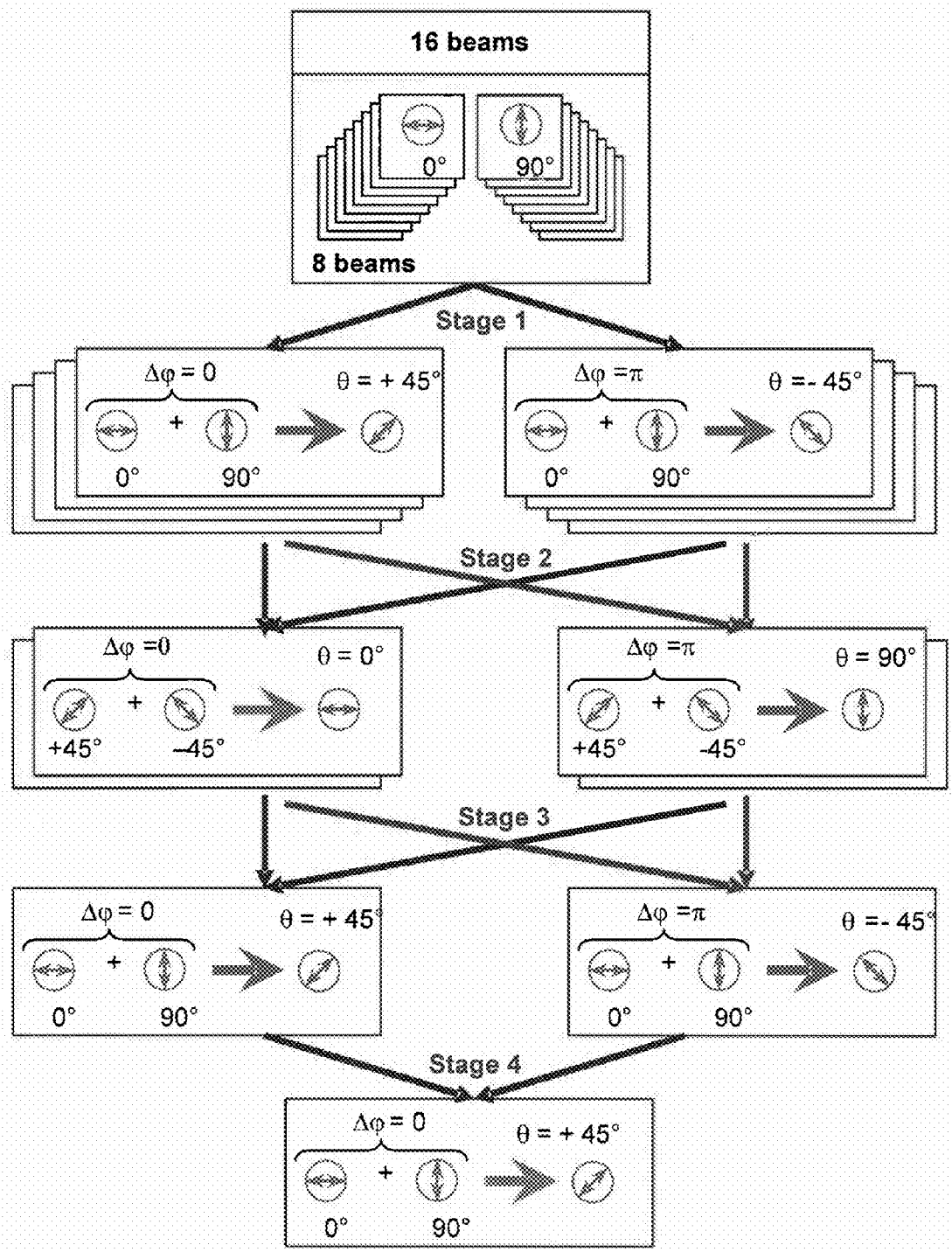
FIG. 3 is an example of a schematic diagram illustrating a multi-stage operation in accordance with an aspect of the subject technology.

In the following detailed description, numerous specific details are set forth to provide a full understanding of the subject technology. It will be obvious, however, to one ordinarily skilled in the art that the subject technology may be practiced without some of these specific details. In other instances, well-known structures and techniques have not been shown in detail so as not to obscure the subject technology.

As used herein and according to one aspect of the disclosure, a laser beam may refer to a beam produced or originated from a laser. In another aspect of the disclosure, a laser beam may refer to a light beam. In yet another aspect of the disclosure, a laser beam may refer to any other beam. An input laser beam or a laser source, as used herein, may refer to either or both of a continuous wave laser beam or a pulse wave laser beam.

The Coherent Polarization Beam Combining (CPBC) devices and methods disclosed herein offer simple, effective and scalable means for multiple beam combination. CPBC provides the benefits of near-field combination with collinear propagation, diffraction-limited beam quality, and 100% theoretical combining efficiency (as compared to combining efficiencies of approximately 40-80% in most phased array beam combiners, where far-field power is lost due to diversion of power into side lobes). The subject technology offers conceptual simplicity, ease of implementation with possible use of off-the-shelf components, low cost, unlimited scalability, 100% theoretical combining efficiency, high power handling, and the ability to combine large-diameter beams (beams that may be >1 cm, as limited by the size of the clear aperture of the optics). Certain embodiments may be integrated into a monolithic optical block to reduce the number of air-glass interfaces. In certain embodiments output polarization may be controlled without polarization control optics in the optical path of the combined output beam.

FIG. 1A an example of a right-hand coordinate (laboratory) frame that illustrates the orientation angles of polarization vectors and optical components. In one operational example, polarizing beam splitters (PBS) may be used to separate an unpolarized or polarized light beam into two beams with orthogonal polarizations. For instance, a typical dielectric PBS cube may split a beam that is linearly polarized with the polarization vector at $\theta=45°$ to the X-axis into its two orthogonal x ($\theta=0°$) and y ($\theta=90°$) linear components (where theta, or $\theta$, may represent the angular property of the polarization vector). In Jones vector notation, polarized monochromatic light is expressed by the complex envelopes of the x and y components of the electric field (as shown below in equation 1), $$J = \begin{bmatrix} A_x \\ A_y \end{bmatrix} = \begin{bmatrix} a_x \exp(i\varphi_x) \\ a_y \exp(i\varphi_y) \end{bmatrix}, \quad (1)$$

where ($a_x$, $a_y$) and ($\phi_x$, $\phi_y$) are, respectively, the electric field amplitudes and phases. The total intensity of a beam represented by the vector J is $|A_x|^2+|A_y|^2$. When the x- and y-polarized vector components are normalized to unity, they are represented by the Jones vectors $[1, 0]^T$ and $[0, 1]^T$, respectively. The linearly polarized light that is being split into these x and y components by the PBS is represented by $[1, 1]^T$ ($\theta=45°$). FIG. 1A shows the laboratory coordinate frame (where unnecessary coordinate frame transformations associated with changes of propagation direction are avoided by assuming that each beam propagates in the Z-direction, even though the PBS output beams propagate in orthogonal directions). FIG. 1B illustrates an example of the effect of rotation of the coordinate frame by 45 degrees on Jones vectors.

A typical PBS can also be used "in reverse" as a polarization beam combiner (PBC), to combine two orthogonal polarization components into a single beam. When two beams with orthogonal polarizations, for example, $[1, 0]^T$ and $[0, 1]^T$, are combined by means of an ideal PBC, the optical power of the combined beam equals the sum of the powers of the input beams. However, the polarization of the output beam depends on the relative phase $\Delta\phi$ between the two input components.

FIG. 2A is an example illustration showing the combination of two linearly polarized beams having orthogonal polarizations with uncontrolled phases, producing an undetermined output polarization state (e.g., a statistical mixture of the states). FIG. 2A shows the results of two beam combination for the case when the two linear x- and y components of equal intensities have not completely correlated (or uncorrelated) phases. Beam 1 has a phase, $\phi_1$, and beam 2 has a phase, $\phi_2$. The relative phase difference ($\Delta\phi$, which is either $\phi_1-\phi_2$, or $\phi_2-\phi_1$) is not completely determined, and the coherence and degree of polarization of the combined output beam depends on the cross-correlation of the phases of the component beams. When is $\Delta\phi$ well-defined and locked (e.g., with servo-controlled electro-optic phase actuators), the output polarization is generally elliptical and can vary from $[1, 1]^T$ ($\Delta\phi=0$) to $[1, -1]^T$ ($\Delta\phi=\pi$) through all the intermediate elliptical states determined by $\Delta\phi$. Such a servo-controlled beam combiner acts as a variable retarder with its optical axis oriented at 45 degrees, because the intensities of the input beams are equal.

FIG. 2B is an example illustration showing the combination of two linearly polarized beams having orthogonal polarizations with phases locked in relation to each other (whether in-phase or out of phase) producing a coherent superposition, in accordance with an aspect the subject technology. FIG. 2B in an example illustration showing the beams combined with $\Delta\phi=0$. The output beam is in the $[1, 1]^T$ polarization state ($\theta=45°$).

Assuming that two PBC elements (PBC 1 and PBC 2) are used with two pairs of orthogonally polarized beams ($[1, 0]^T$ and $[0, 1]^T$), where each pair has its respective beams phase locked so that $\Delta\phi_1=0$ for beams entering PBC 1 (i.e., that the beams entering PBC 1 are in-phase) and $\Delta\phi_2=\pi$ for beams entering PBC 2 (i.e., that the beams entering PBC 2 are 180 degrees out-of-phase), the combining process can be represented by an addition operation on the appropriate Jones vectors (as expressed below in equation 2), $$PBC1: \begin{bmatrix} 1 \\ 0 \end{bmatrix} + \begin{bmatrix} 0 \\ 1 \end{bmatrix} = \begin{bmatrix} 1 \\ 1 \end{bmatrix}; (\theta = +45°) \quad (2)$$

$$PBC2: \begin{bmatrix} 1 \\ 0 \end{bmatrix} + \begin{bmatrix} 0 \\ 1 \end{bmatrix} \exp(i\pi) = \begin{bmatrix} 1 \\ -1 \end{bmatrix}; (\theta = -45°),$$

where the phase factor $\exp(i\pi)$ corresponds to the relative phase difference $\Delta\phi_2=\pi$. In this example, the total intensity of each of the combined beams is the sum of the individual input intensities, $|A_x^{(1)}|^2+|A_y^{(1)}|^2=2$ (the superscripts indicate the first stage of combining), where $A_x^{(1)}=1$, and $|A_y^{(1)}|$ are the values of the scalar components of the combined Jones vector, along the X- and Y-axis, respectively. The resultant two output beams are completely polarized, that is, their polarization states are coherent superpositions of the input orthonormal basis states, $[1, 1]^T$ and $[1, -1]^T$. Further if a third PBC element (PBC 3) is utilized, then since the two combined beams have orthogonal polarizations, they can be further combined with the third PBC element (PBC 3) (as expressed below in equation 3), $$PBC3: \begin{bmatrix} 1 \\ 1 \end{bmatrix} + \begin{bmatrix} 1 \\ -1 \end{bmatrix} \exp(i\Delta\varphi_3) = \begin{bmatrix} 1 + \exp(i\Delta\varphi_3) \\ 1 - \exp(i\Delta\varphi_3) \end{bmatrix}, \quad (3)$$

which is rotated 45° with respect to PBC 1 or PBC 2. The total intensity of the beam combined by PBC 3 is, again, the sum of the two component intensities (as expressed below in equation 4), $$|A_x^{(2)}|^2+|A_y^{(2)}|^2=2[1+\mathcal{R}e\{\exp(i\Delta\phi_3)\}+1-\mathcal{R}e\{\exp(i\Delta\phi_3)\}]=4. \quad (4)$$

When the relative phase of the two output beams produced by PBC 1 and PBC 2 are locked and set to $\Delta\phi_3=0$ (i.e., that the two output beams produced by PBC 1 and PBC 2 are in-phase), the polarization vector of the combined output of PBC 3 is parallel to the X-axis of the laboratory frame. The combination process can be repeated and cascaded using additional PBC elements, provided all the beams are phase-locked in relation to each other (whether in-phase or out-of-phase).

FIG. 3 is an example of a schematic diagram providing a conceptual view of an embodiment of the subject technology, where coherent polarization beam combining (CPBC) is utilized to combine 16 beams, and where the output beam is linearly polarized at 45 degrees. FIG. 3 illustrates an example of coherent combination of 16 beams, where, in a first stage of beam combination (Stage 1), the orthogonal polarization states ($[1, 0]^T$ and $[0, 1]^T$) form a basis set in the laboratory frame. Stage 2 provides rotation of the coordinate frame by 45 degrees (as shown in FIG. 1B), so that the pairs of the orthogonal polarization states are related to each other such that $\theta = \pm 45$ degrees $[1, 1]^T$ and $[1, -1]^T$).

The combined beams produced in Stage 1 can then form a new basis for a set in the rotated frame and be coherently combined into new polarization states (with $\theta=0°$ or $\theta=90°$). This coordinate rotation is equivalent to rotation of the PBC elements by 45°. The process of combination, followed by rotation of the coordinates back and forth by $\pm 45°$, is repeated until all the beams are combined into a single output.

A practical alternative to rotation of the PBC components is rotation of the beam polarization vectors in the laboratory frame, from $\theta = \pm 45°$, back to $\theta = 0°$ and $\theta = 90°$. This can be accomplished utilizing polarization rotators, for example and without limitation, half-wave plates oriented at 22.5° to the X-axis, polarization rotators made of optically active materials (e.g., quartz), Faraday rotators, or rotators made of a variable retarder followed by a quarter-wave plate.

Figure 4:
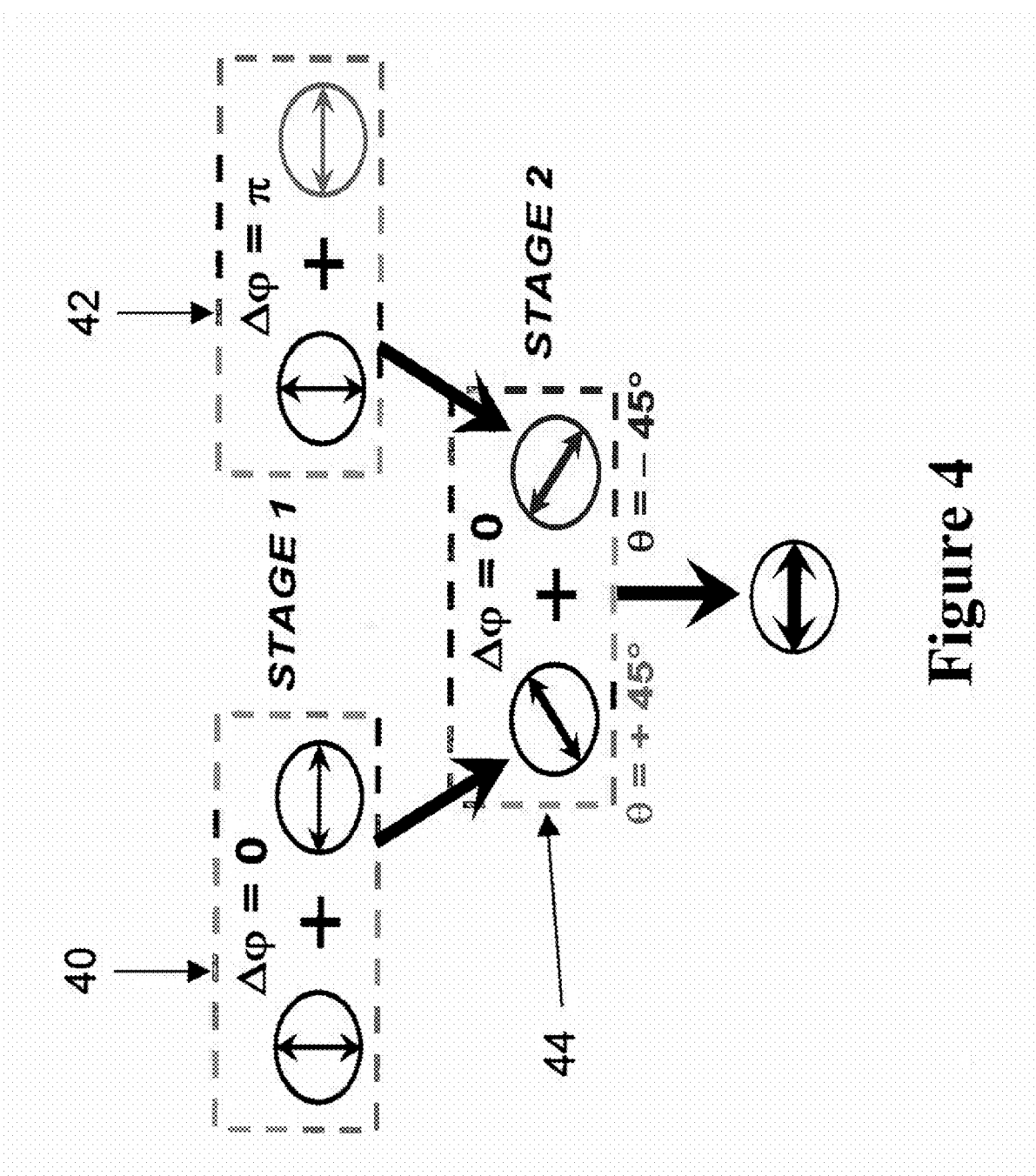
FIG. 4 is an example of a two-stage operation in accordance with an aspect of the subject technology.

FIG. 4 is an example of a conceptual diagram of a two-stage CPBC concept with four linearly polarized beams of equal power, in accordance with an aspect of the subject technology. As shown in FIG. 4, in block 40 two input beams are combined to create a polarization vector with an angular representative vector, theta ($\theta$), of positive 45 degrees, as illustrated by the left-most polarization circle in block 44. In block 42, two input beams are combined to create a polarization angular vector, theta ($\theta$), of negative 45 degrees, as illustrated by the right-most polarization circle in block 44. The two polarization vectors in block 44 are then combined to create a combined beam that is suitable for further combination. By controlling the relative phases of pairs of orthogonally polarized beams, new polarization states are created at polarization combiners. As noted, these new states are suitable for further combination.

Figure 5A:
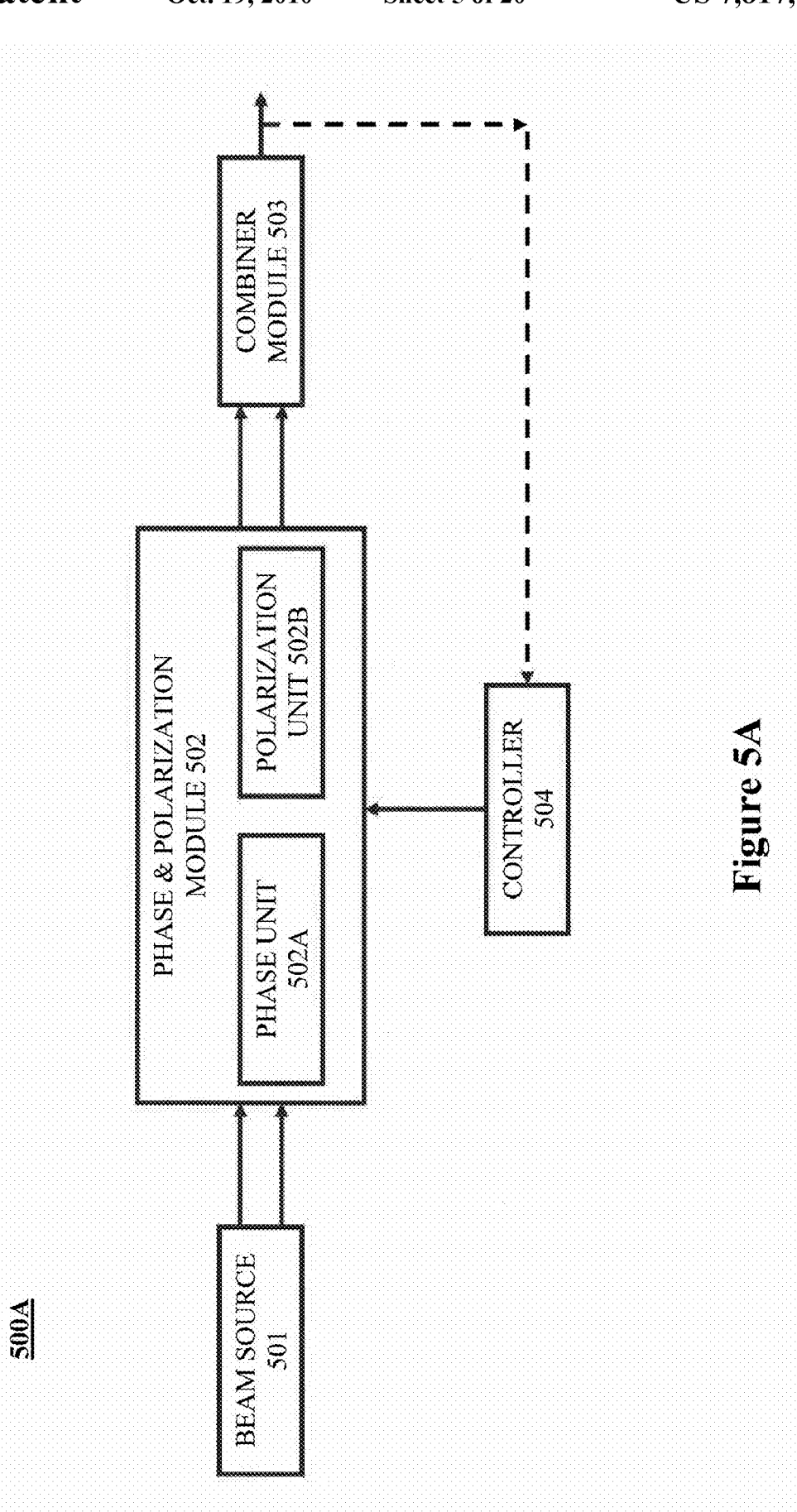
FIG. 5A is an example of a block diagram of a configuration of a beam combining device in accordance with an aspect of the subject technology.

FIG. 5A is an example of a block diagram of a configuration of a laser beam combining device 500A in accordance with an aspect of the subject technology. As shown in FIG. 5A, device 500A comprises a beam source 501, a phase and polarization module 502, a combiner module 503, and a controller 504. Phase and polarization module 502 may include phase unit 502A and polarization unit 502B. While FIG. 5A is illustrated with two laser beams, the subject technology is not so limited, and may be applied to any number of laser beams according to certain aspects of the disclosure.

In an embodiment of the subject technology, beam source 501 may be a laser source with a beam splitter to derive at least two laser beams that are then amplified using two separate laser amplifiers, or beam source 501 may be multiple laser sources. In certain embodiments, beam source(s) 501 provide a plurality of laser beam inputs, comprising at least a first laser beam and a second laser beam, to phase and polarization module 502. In another aspect of the disclosure, phase and polarization module 502 may include beam source 501, and polarization unit 502B may be a part of beam source 501, so that the laser beams are polarized at beam source 501.

In certain embodiments, the first laser beam and the second laser beam may have unequal power. Having unequal power may refer to having a degree of unequal power, which may be, by way of illustration and not limitation, (i) less than a one percent difference, (ii) at least a one percent, but less than a five percent difference, (iii) at least a five percent, but less than a ten percent difference, (iv) at least a ten percent, but less than a twenty percent difference, and (v) a twenty percent or greater difference. These are merely examples however, and the subject technology is not limited to these examples. According to an aspect of the disclosure, regardless of any degree of unequal power between the first and second laser beams, the subject technology, using both polarization and phase control as explained herein, is capable of a combined power efficiency approaching nearly 100% in practically all instances. In instances where the input beams may have a degree of unequal power, the combined output beam will have an output polarization of other than 45 degrees.

Controller 504 may comprise a central processing unit, or CPU, that processes software instructions stored in a memory, and electronic circuitry to control the phase and polarization units. For example, controller 504 may be a programmable logic controller, or PLC, with both a processor and a memory. Memory may be machine-readable media, such as a readable-writable memory or a read-only memory. Instructions stored in such a memory may include instructions that may be executed by the processor contained in controller 504. The executed instructions may be configured to control the phase and polarization module 502, and/or sub-components phase unit 502A and/or polarization unit 502B.

In certain non-limiting embodiments, controller 504 provides phase control for input laser beams, for instance through control of an electro-optic (or other) modulator. In certain, non-limiting embodiments, the polarization unit 502B comprises at least one polarization control unit per input laser beam. For instance, with two input laser beams comprising a first and a second laser beam, the polarization unit 502B may comprise two polarization controllers, one for each of the first and second laser beams. In certain, non-limiting embodiments, controller 504 may control two polarization rotators that provide control over the polarization of the first and second laser beams. In certain non-limiting embodiments, controller 504 may be configured to control polarization control unit 502B including controlling each of two polarizers independently or individually, to thereby control the polarization of each of the first and second laser beams independently or individually. Controller 504 may, for example, control a polarization rotator to thereby polarize at least one of the first or second laser beams so that the two beams are orthogonally polarized. In another example, controller 504 may control one or more polarization rotators to polarize each one of the first and second laser beams (individually or together) so that the two beams are orthogonally polarized. A polarization controller or polarization control unit may comprise, by way of illustration and not limitation, a half-wave plate or another component that can control or modify the polarization of a beam, such as a polarization rotator.

When outputted from polarization unit 502B (or the phase and polarization module 502), the polarization of the first laser beam may be orthogonal or substantially orthogonal to the polarization of the second laser beam. According to some aspects of the disclosure for linearly polarized beams, the term "orthogonal" may refer to, by way of illustration and not limitation, (i) 90 degrees in difference between the polarization vector of a first laser beam and the polarization vector of a second laser beam, (ii) 90 degrees+/−1 degree in difference between the polarization vector of a first laser beam and the polarization vector of a second laser beam, (iii) 90 degrees+/−3 degrees in difference between the polarization vector of a first laser beam and the polarization vector of a second laser beam, (iv) 90 degrees+/−5 degrees in difference between the polarization vector of a first laser beam and the polarization vector of a second laser beam, or (v) 90 degrees+/−10 degrees in difference between the polarization vector of a first laser beam and the polarization vector of a second laser beam. These are merely examples, however, and the subject technology is not limited to these examples. For elliptically polarized beams, "orthogonal" may refer to a situation where the major axes of the polarization ellipses are orthogonal, the handedness (left or right) are opposite, and the ellipticities are identical.

In certain, non-limiting embodiments, phase control of the first and/or second laser beams may be either passive or active. An example of passive phase control includes using two or more laser sources that are intra-cavity coupled and whose phases are locked through a self-organization process. An example of active phase control includes using a phase unit 502A that comprises at least one modulator that is configured to manipulate the phase of each of the first laser beam and the second laser beam. If the phase unit 502A utilizes a first modulator for the first laser beam and a second modulator for the second laser beam, then controller 504 may control the two modulators so that controller 504 can control the phases of the first and second laser beams according to one aspect of the disclosure. For instance, controller 504 may be configured to control each of the two modulators independently or individually so that controller 504 can control the phase of each of the first and second laser beams independently or individually. Controller 504 may, for example, control the modulators so that the first and second beams are phase-locked to each other. Controller 504 may control each of the modulators independently.

In certain embodiments, the phase unit 502A comprises one or more modulators, such as electro-optic or acousto-optic modulators. In certain embodiments, controller 504 controls phase unit 502A to manipulate the phases of the first laser beam and the second laser beam to keep them "phase locked" in relation to each other. According to aspects of the disclosure, "phase locked" laser beams may refer to, by way of illustration and not limitation, laser beams: (i) whose phases are in-phase ($\Delta\phi_1=0$), (ii) whose phases are out-of-phase ($\Delta\phi_2=\pi$), or (iii) whose phases maintain a difference that fluctuates within a range. For example, by way of illustration and not limitation, a difference that fluctuates within a range may be a difference that remains approximately: (i) within $1/32$ of a wavelength or less (expressed as $\leq 1/32\lambda$), (ii) within $1/16$ of a wavelength or less (expressed as $\leq 1/16\lambda$), or (iii) within $1/8$ of a wavelength or less (expressed as $\leq 1/8\lambda$). In certain, non-limiting embodiments, phase lock may be controlled to within $\leq 1/10$ of a wavelength (expressed as $\leq 1/10\lambda$). These are merely examples, however, and the subject technology is not limited to these examples.

In certain embodiments, combiner module 503 comprises a polarization beam combiner that is configured to receive the phase-locked and orthogonal first and second laser beams, and to combine the two. As noted above, a combined power efficiency using the subject technology may approach nearly 100% in many instances, and at least 90% percent or more in most instances. For example, if the first and second laser beams each have a power of approximately 2 kilowatts, a combined efficiency of almost 4 kilowatts may be realized. In certain embodiments, the output of combiner module 503 may provide feedback to controller 504. Controller 504 may utilize this feedback to manipulate the phase and/or polarization of the plurality of input laser beams (as further explained herein) to achieve, for example, a maximum power efficiency.

Throughout FIGS. 5B, 6, 8, and 9, various modulators, polarizers, half-wave plates, collimators, and amplifiers are shown as located prior to their respective polarization beam combiner. It is to be understood that these components may be arranged in any order prior to a respective polarization beam combiner, with the operations of polarization and phase control being performed prior to beam combining, according to certain aspects of the subject technology.

Figure 5B:
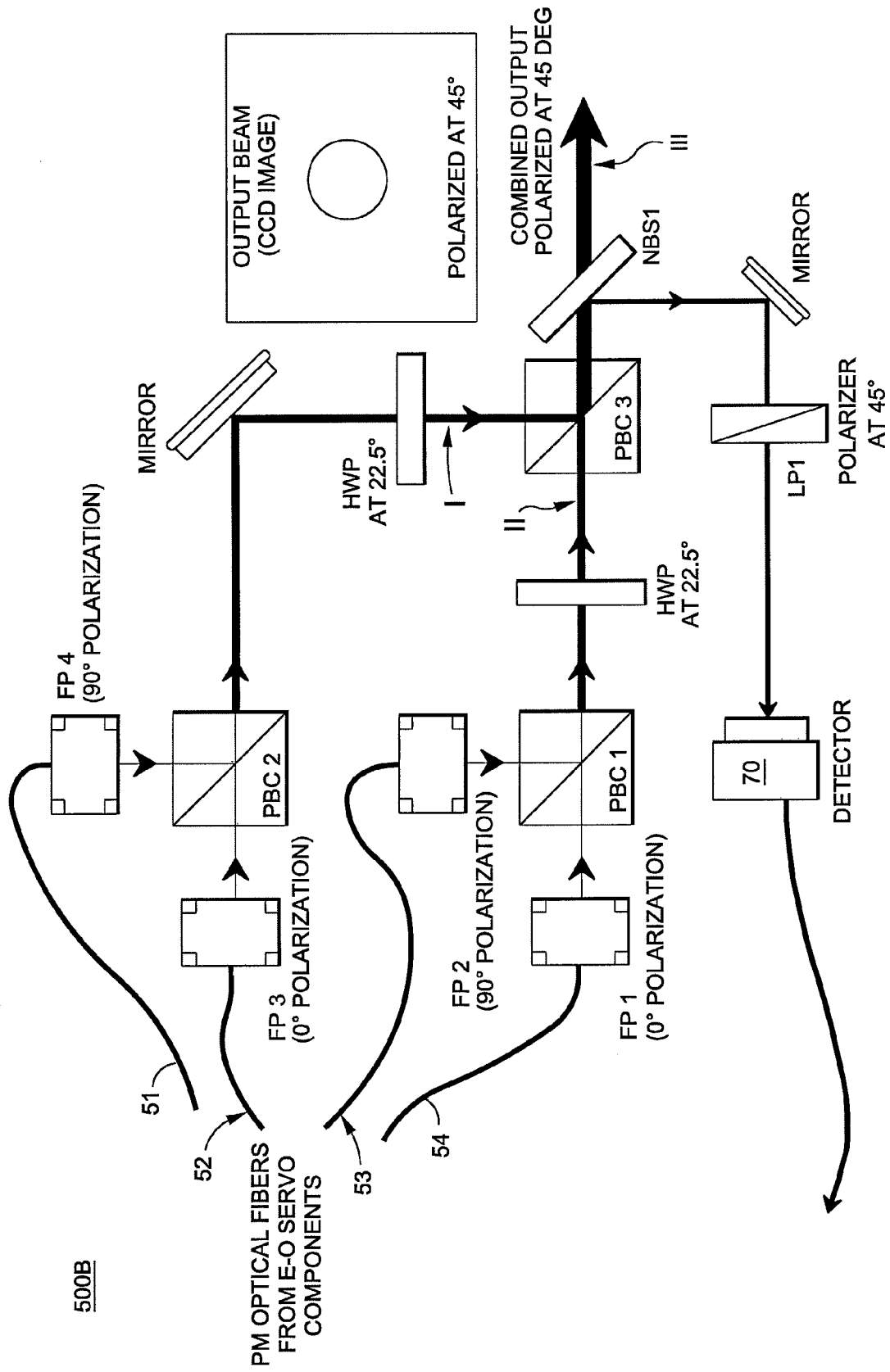
FIG. 5B is an example of a schematic diagram of a configuration of a beam combining device in accordance with an aspect of the subject technology.

FIG. 5B is an example of a schematic diagram of an implementation of a four beam coherent polarization beam combiner (CPBC) device 500B that uses three polarizing beam combiners (PBCs) and two half-wave plates (HWPs) at 22.5 degrees, in accordance with an embodiment of the subject technology. The conceptual diagram of FIG. 5B was used in an actual optical setup to illustrate the CPBC concept. Four input beams 51 through 54 were delivered via optical fibers to fiber ports (FPs) 1 through 4 and collimated, balanced and polarization-adjusted using half-wave plates followed by polarizers (half-wave plates and polarizers not shown). FP 1 delivered a laser beam with a 0 degree polarization. FP 2 delivered a laser beam with a 90 degree polarization. FP 3 delivered a laser beam with a 0 degree polarization. FP 4 delivered a laser beam with a 90 degree polarization. In certain embodiments, a fiber port (FP) may be referred to as a "collimator," In certain, non-limiting embodiments, orthogonally polarized beams may be delivered via polarization maintaining fiber or through free-space.

The two pairs of orthogonally polarized beams with approximately equal powers were first combined with PBC 1 and PBC 2, producing two beams that were linearly polarized at, respectively, 45° and −45°. After passing through the half-wave plates HWP1 and HWP2 with optical axes oriented at 22.5°, the combined beams at points I and II have had their polarization vectors rotated to $\theta=0°$ and $\theta=90°$, respectively. The two orthogonally polarized beams (shown at points I and II) were combined at PBC 3, producing a combined output beam polarized at 45 degrees.

In certain embodiments, a small portion of the combined output can be picked off with a beam splitter, such as beam splitter NBS1 shown in FIG. 5B, and sent to a detector 70 to provide feedback to the device. Detector 70 may be a photodiode detector, or other optical detector. The feedback signal may be sent to a servo control device (not shown in FIG. 5B) configured to manipulate phase actuators that optimize the phases of the four input beams 51 through 54. As part of the feedback, a linear polarizer (such as LP1 shown in FIG. 5B) may be oriented at 45° in front of detector 70 to optimize the phases of the two beams combined in PBC 3, which may change the polarization of the combined output beam at point III. Since, in certain embodiments, that the intensity of the combined output beam at point III is a parameter that is optimized by the device 500B, phase shifts of $\pi$ may be produced automatically utilizing a servo control device to create appropriately orthogonal polarization states (at 45° and −45°) at PBC 2 and PBC 3, to thereby maximize output power.

Figure 6:
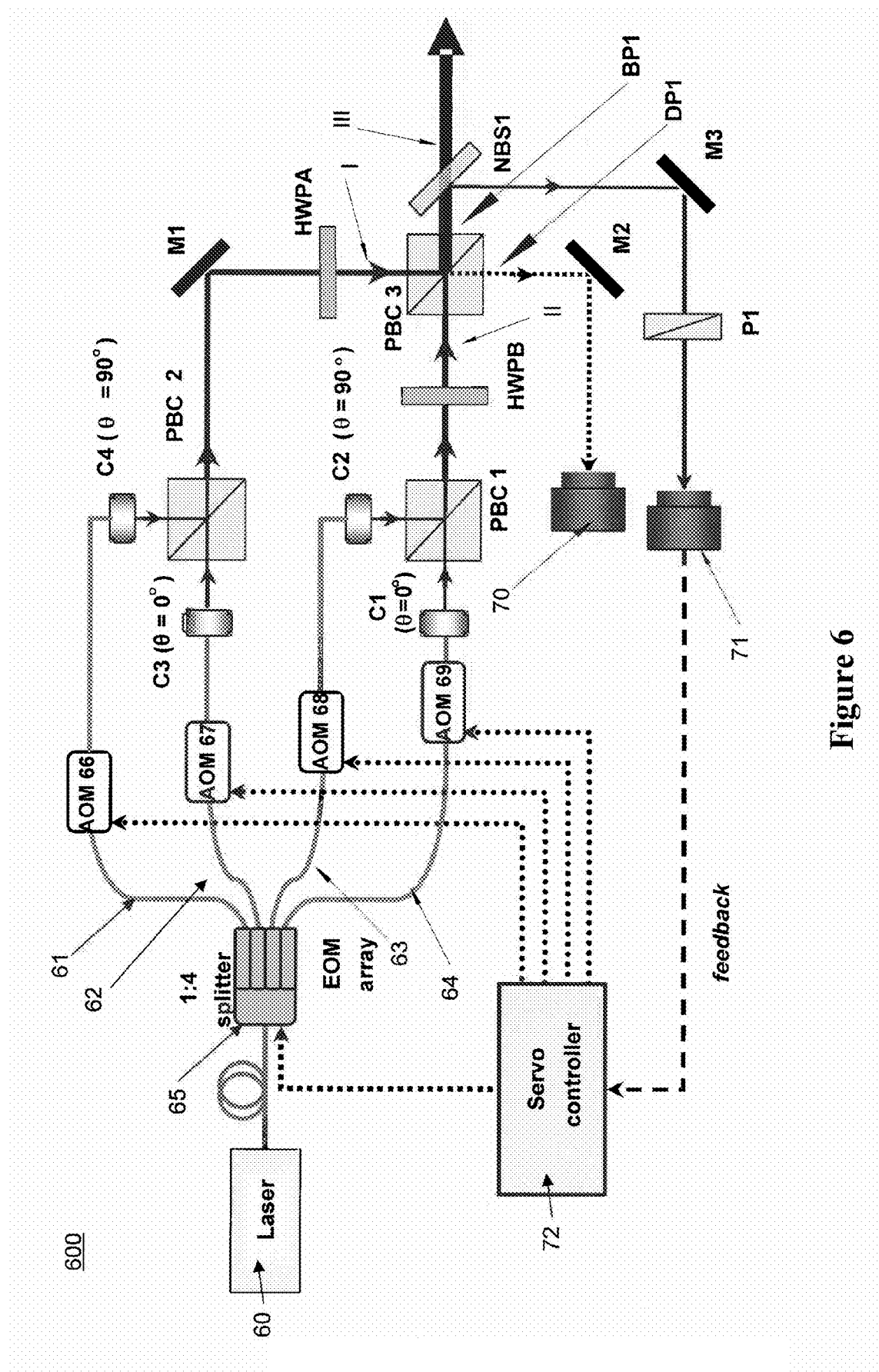
FIG. 6 is an example of a schematic diagram of a configuration of a beam combining device in accordance with an aspect of the subject technology.

FIG. 6 is an example of a schematic of a four beam CPBC with a dark port detector and a controller, in accordance with an embodiment of the subject technology. As seen in FIG. 6, the input beams 61 through 64 originate from a single narrow-band laser source 60. While a single laser source is shown for the sake of simplicity as a demonstrative example, in certain embodiments of the subject technology, including the embodiment shown in FIG. 6, any number of laser sources could be implemented. As shown in FIG. 6, the laser delivers a beam to electro-optical modulator array 65, where the laser beam is split into multiple beams such as beams 61 through 64.

In certain embodiments, electro-optical modulator array 65 may assign each of four beams 61 through 64 an identifying, separate, phase modulation frequency that may be used as an identifier for individual beams. In certain embodiment electro-optical modulator array 65 may be a Pockels, liquid crystal, Kerr, piezo modulator, or another type of electro-optical or mechanical modulator.

As shown in FIG. 6, the four beams 61 through 64 are respectively supplied to acousto-optic modulators (AOMs) 66 through 69, respectively. The acousto-optic modulators 66 through 69 are utilized in certain embodiments to control the phases of each of beams 61 through 64. AOMs 66 and 67 are controlled by a controller such as servo controller 72 such that the phases of beams 61 and 62 are phase-locked in relation to each other (whether in-phase or out of phase). AOMs 68 and 69 are controlled by controller 72 such that the phases of beams 63 and 64 are phase-locked in relation to each other (whether in-phase or out-of-phase). All of AOMs 66 through 69 may be operated at a nominal frequency of 80 MHz, with small adjustments to this frequency adding a phase lead or lag as required. One of skill in the art would recognize that other operating frequencies could be employed.

In certain embodiments, an electro-optic modulator, such as EOM array 65 shown in FIG. 6, may be used in place of any or all of AOMs 66 through 69. That is, those of skill in the art would readily understand that an EOM could be used to phase-lock an optical beam in relation to another beam.

Controller 72 may be used to compensate for optical path mismatch in the four beams 61 through 64, as well as for phase perturbations produced in the optical fibers by temperature variations. Controller 72 may also be used to control EOM array 65 and/or AOMs 66 through 69, and/or may be used to control EOMs that may be used to replace AOMs 66 through 69. The beams 61 through 64 may be respectively polarized at their source, or the beams may be polarized using a polarizer, or through other known methods. As shown in FIG. 6, beams 61 and 62 are made orthogonal to each other at collimators C4 and C3. Beams 63 and 64 are made orthogonal to each other at collimators C2 and C1. Once the respective beam pairs are orthogonal to their respective component beams, each of the pairs is fed into polarizing beams combiners (PBCs) 1 and 2.

At collimators C1 through C4, the beams may be collimated to various diameters. In one exemplary embodiment, collimators C1 through C4 collimated their beams to a size of substantially 9 mm diameter. The polarization of beams 61 through 64 may be controlled with polarizers placed in the optical path as needed (e.g., anywhere between laser 60 and PBC 1 and/or PBC 2) prior to the beam combining at any of the PBCs. Power could also be adjusted using variable attenuators, for example, combinations of half-wave plates and polarizers. Half-wave plates may be placed in front of collimators C1 through C4 (half-wave plates in front of the collimators are not shown in FIG. 6) or other appropriate locations (e.g., anywhere in the optical path of a respective laser beam).

As shown in FIG. 6, the pairs of orthogonally polarized beams are first combined using two polarizing beam combiners, PBC 1 and PBC 2, to produce two new, linearly polarized beams. After passing through the half-wave plates (HWPA and HWPB), the polarization vectors of the two combined beams at points I and II are, respectively, rotated to θ=0° and θ=90°, and the beams are then sent to PBC 3 for final-stage combination.

A small portion of the combined output ("the servo beam") is picked off with a non-polarizing beam splitter NBS1 and sent to photodiode detector 71 to provide a control signal ("servo feedback") to voltage controlled oscillators (VCOs) that are a part of each AOM 66 through 69. The VCOs vary the frequencies of the AOMs to optimize the phases of the beams so that the beams outputted by AOMs 66 and 67 remain phase locked in relation to each other, and also so that the beams output by AOMs 68 and 69 remain phase locked in relation to each other. Controller 72 may be utilized to control phase perturbation and to maintain maximum brightness and power of the combined output beam at point III. Controller 72 may also be used to stabilize the polarization of the combined output beam emerging from PBC 3 at point III. In certain embodiments, a linear polarizer (such as P1 in FIG. 6) may be placed in front of photodiode detector 71. Without P1, the output polarization at point III may be undefined and may therefore depend upon the relative phase difference between the two beams that are incident on PBC 3.

Consider that each of PBC 1, PBC 2, and PBC 3 produces two separate outputs, corresponding to the two separate paths the light can take in a PBC. The main, combined output emerges from a bright port (e.g., at BP1 of PBC 3), and any residual light, which does not contribute to the combined output, emerges from a dark port (e.g., at DP1 at PBC 3). States otherwise, the greater the difference between an orthogonal 90 degrees between the first laser beam and the second laser beam, the brighter the polarization light value will be at the dark port output of the PBC. Conversely, the closer that the first laser beam and the second laser beam approach an orthogonal value of 90 degrees, the darker the intensity at the dark port output of the PBC. In certain embodiments, through observation of the dark port, the efficiency of the combination of any of the two beams at any PBC (e.g., PBC 1, PBC 2, and/or PBC 3) may be monitored. In certain embodiments, the output of the dark port may be monitored by a photodetector device that provides polarization feedback to controller 72. The polarization feedback from the dark port detector may then be used for control and manipulation of the phase and polarization module.

In an alternate embodiment, EOM array 65 may produce an odd number of laser beams (e.g., beams 61, 62, and 64). In this case, some or all of AOM 68, C2, and PBC 1 may be eliminated or not used. In another configuration, some or all of AOM 68, C2, PBC 1, AOM 69, C1, and HWPB may be eliminated or not used. In certain, non-limiting embodiments, with more than 4 input laser beams, the number of components is scaled according to the number of input beams.

In yet another alternate embodiment, HWPA and HWPB may be replaced with polarization rotators comprising polarization modulators that are controlled each controlled electronically by controller 72.

Figure 7:
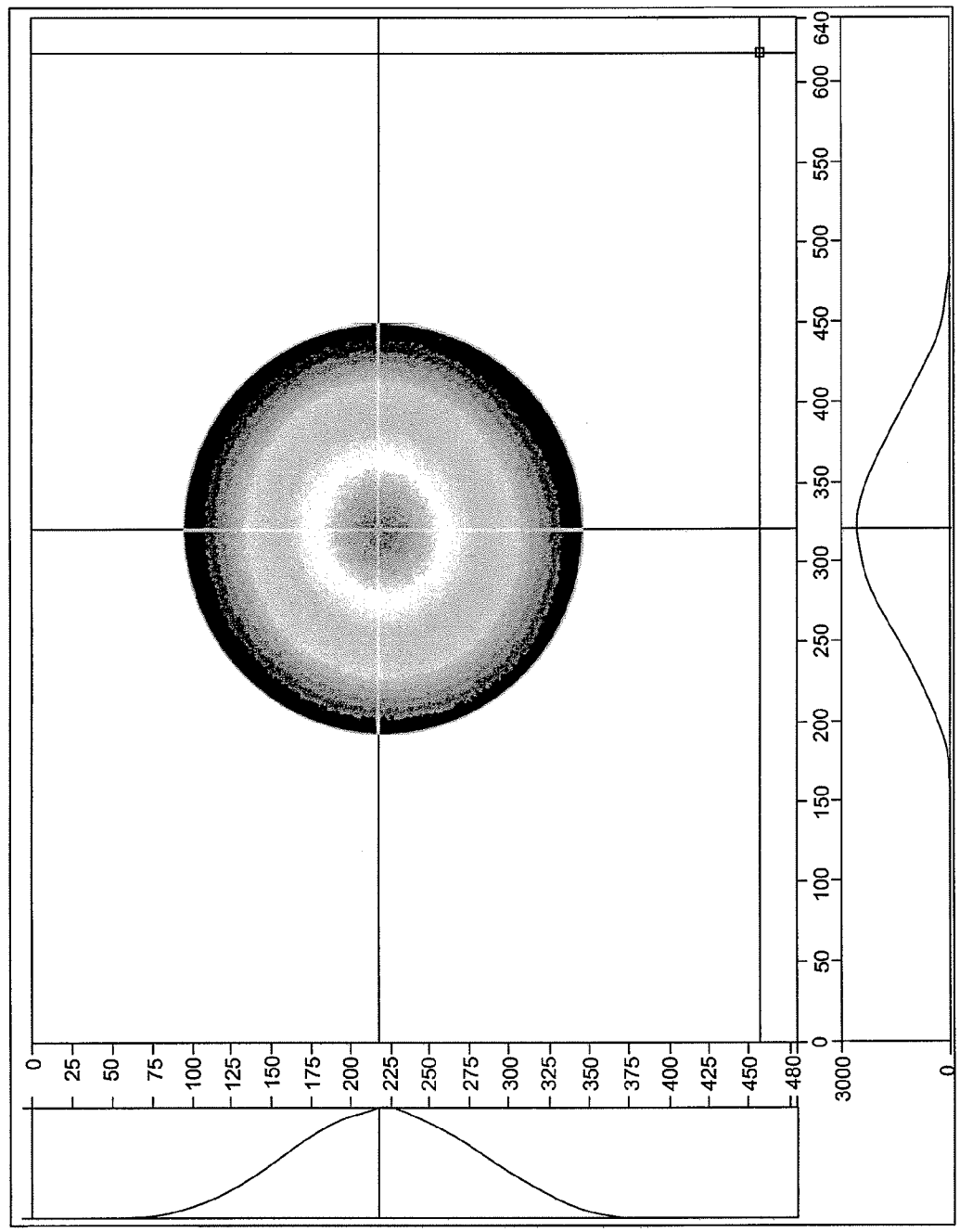
FIG. 7 is an example of an output image for a laser beam combining device, in accordance with an aspect of the subject technology.

FIG. 7 is an example image of a combined output produced by an embodiment of the subject technology as described in relation to FIG. 6, where a CPBC device and/or method is used to produce a combined output beam from four polarized input beams.

Figure 8:
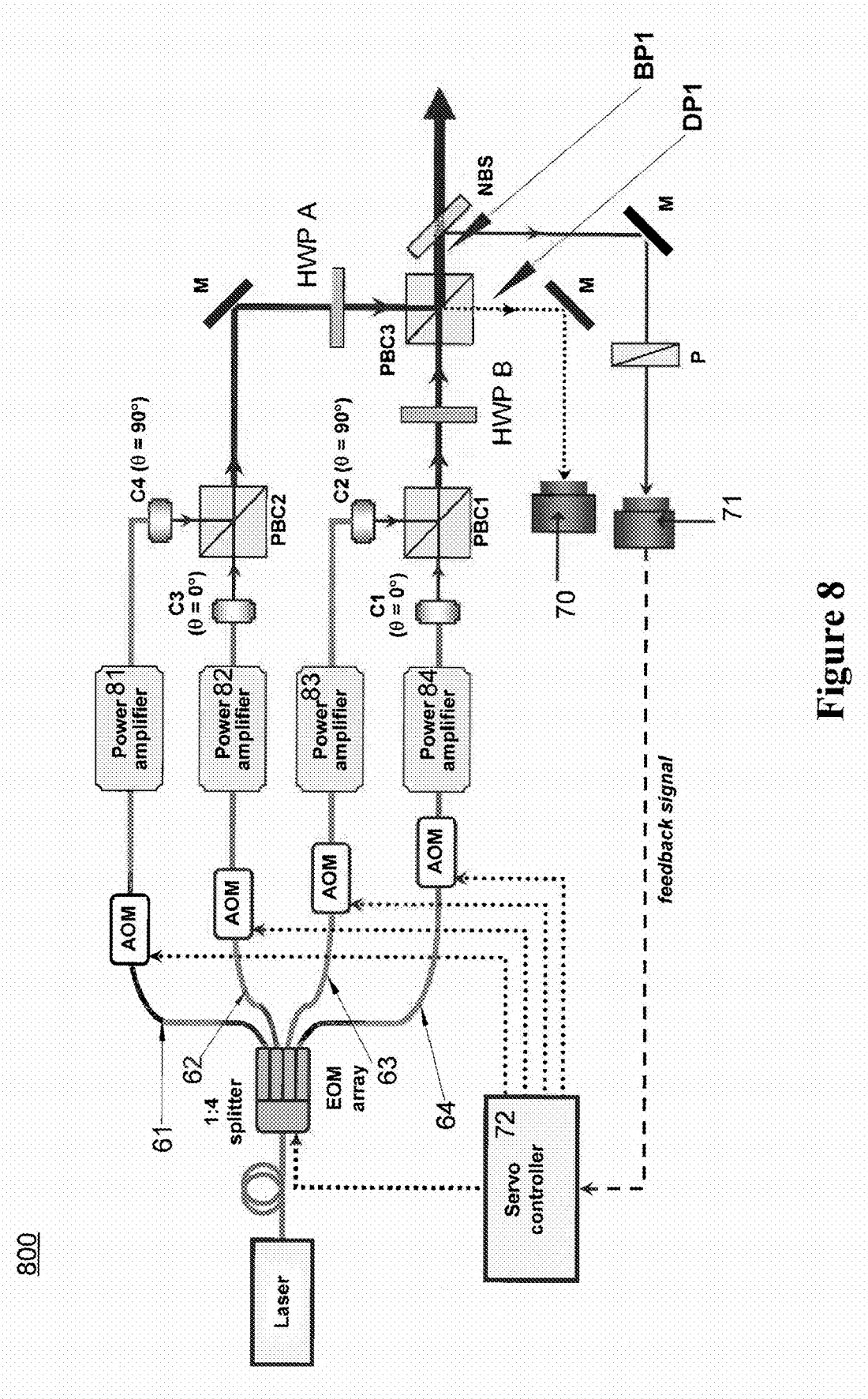
FIG. 8 is an example of a schematic diagram of a configuration of a beam combining device in accordance with an aspect of the subject technology.

FIG. 8 is a schematic of a four beam CPBC with power amplifiers, in accordance with an embodiment of the subject technology. For the sake of brevity, like components in comparison to FIG. 6 are not re-discussed. FIG. 8 shows an embodiment where power amplifiers 81 through 84 have been placed in the optical paths of beams 61 through 64, respectively, as would be implemented for many applications.

Although not shown, controller 72 may be electrically coupled with each of amplifiers 81 through 84 so as to be configured to implement power variability and control amplifiers 81 through 84.

Figure 9:
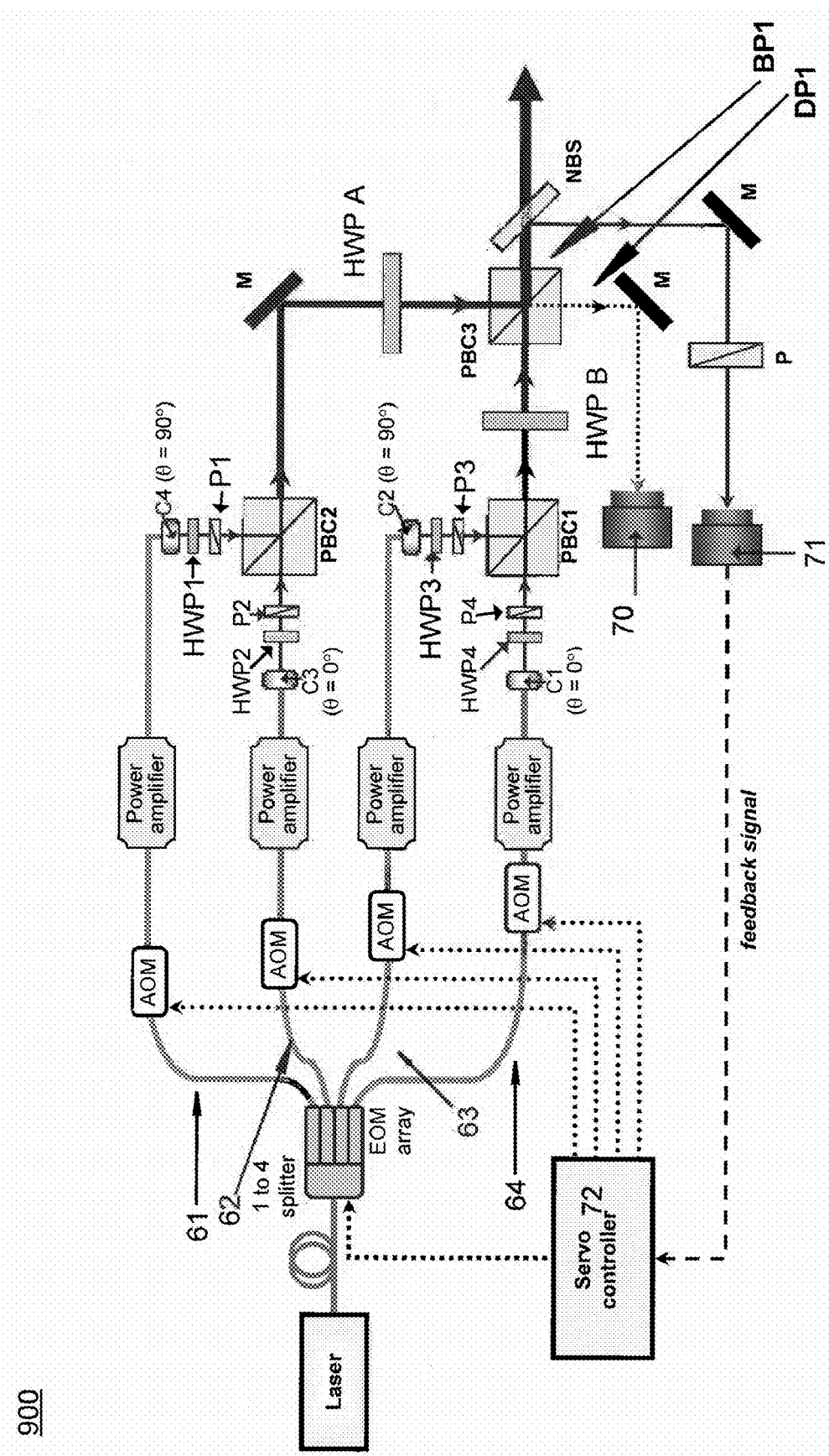
FIG. 9 is an example of a schematic diagram of a configuration of a beam combining device in accordance with an aspect of the subject technology.

FIG. 9 is an example of a schematic of a four beam CPBC with half-wave plates and clean-up polarizers placed before the polarizing beam combiners (PBC), in accordance with an embodiment of the subject technology. In one operation, to demonstrate the capability of the CPBC architecture to accommodate power-imbalanced sources (that is, a degree of unequal power between the two sources), differences in the power levels of beams 61 through 64 were intentionally triggered by rotating half-wave plates (HWPs 1 through 4) before clean-up polarizers P1 through P4. The measured powers of input beams 61 through 64 entering the CPBC were 315 μW, 925 μW, 624 μW, and 287 μW, respectively. The relative power ratio of the four beams was thus 1.1:3.2:2.2:1. With such unbalanced input sources, the polarizations of beams combined at PBC 1 and PBC 2 were no longer at ±45°. To combine the two beams at PBC 3 with minimum losses, the HWPs had to be rotated from 22.5° to new orientations, to produce linear polarizations at 0° and 90° that were suitable for further combination. The optimum orientation angles of the two HWPs were found by phase-locking all four of beams 61 through 64 and then rotating the respective HWP to minimize the dark port signal at PBC 3.

Also shown in FIG. 9 is dark port detector 70. While one dark port detector is shown in FIG. 9, in certain embodiments each of PBC 1, PBC 2, and PBC 3 may be optically coupled to an associated dark port detector. In certain embodiments, the polarization directions of the input beams (beams 61 and 62, and 63 and 64) may be adjusted by rotating the clean-up polarizers and half-wave plates HWP1 through HWP4, and monitoring at least one of the dark ports of PBC 1, PBC 2, and PBC 3 for emitted light. With polarizations optimized, the dark port signals, and thus the losses in the beam combiners, were negligible, as were insertion losses at the AR-coated optics in the beam paths.

To test efficiency during an operational setup of the components illustrated in FIG. 9, device 900 was measured by comparing the outputs of the bright and dark ports of PBC 3. The measured power of the bright port at BP1, when compared to the dark port at DP1, yielded combining efficiencies as great as 96% at mW source power level. (A typical image capture of the nearly diffraction-limited combined beam is shown in FIG. 7.) The measured $M^2$ values of the combined output beam in the x- and y-dimension (laboratory frame) were 1.03 and 1.06, respectively. When all four input beams were power-balanced, the first stage of combination (at PBC 1 and PBC 2) produced two beams of equal power that were linearly polarized at +45° and −45° to the optical axes of the beam combiners. The two HWPs, oriented at 22.5°, were then used to rotate the polarizations of these ±45° beams to 0° and 90°, respectively, to enable their combination at PBC 3. When the beams were phase-locked, the output polarization was linear at 45°.

The ability to combine imbalanced beams was also tested by blocking one of the four input beams (various individual beams were blocked at different points in time). With one input beam blocked, combining efficiency as measured at the output of PBC 3 dropped from 96% to between 65% and 85%, depending on the specific beam blocked. After adjustment of the corresponding half-wave plate, the combining efficiency returned to values around the initial 96% for three combined beams. Such a demonstration shows that the subject technology can work for an arbitrary number of beams with an arbitrary imbalance in input power sources, if the polarizations of the beams can be properly re-adjusted, such as by using the technique described above.

Figure 10A:
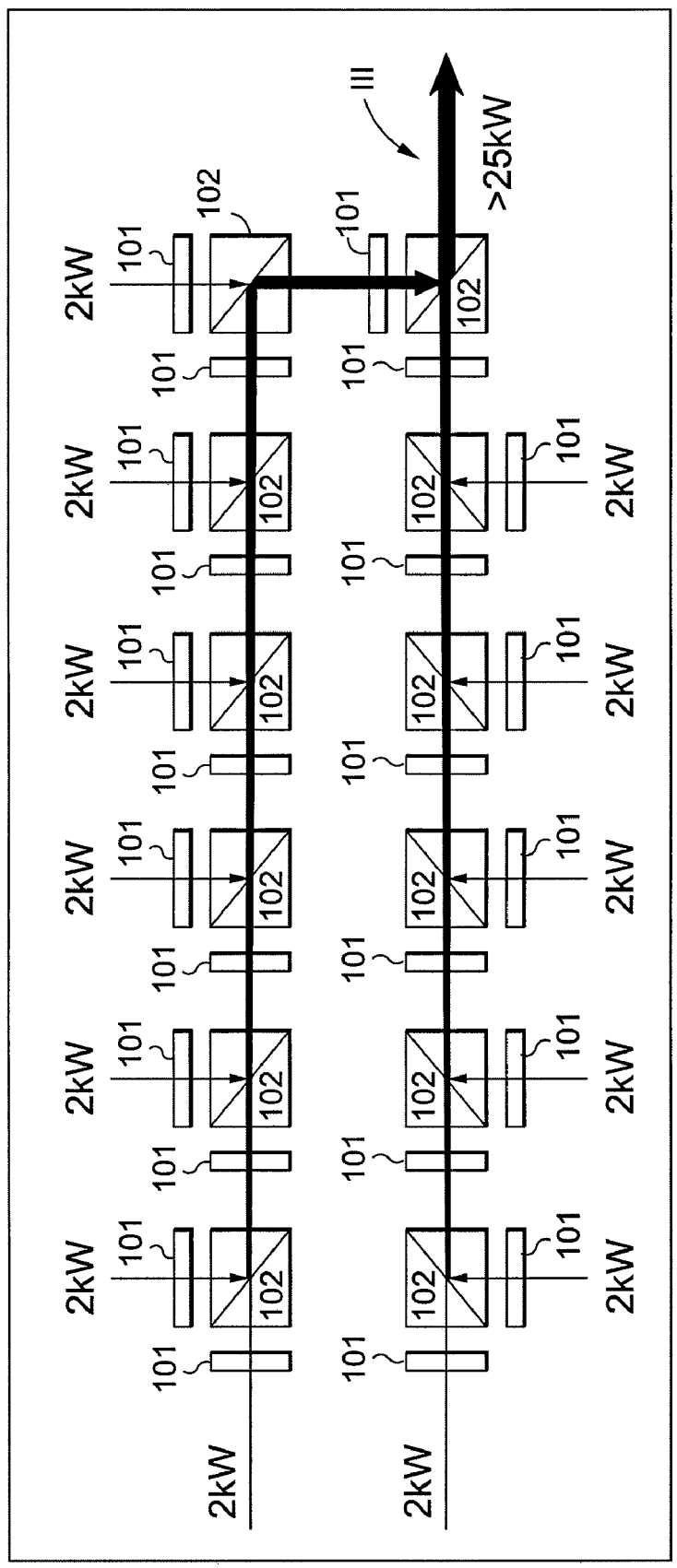
FIG. 10A is an example of a schematic diagram of a thirteen beam combiner, in accordance with an aspect of the subject technology.
Figure 10B:
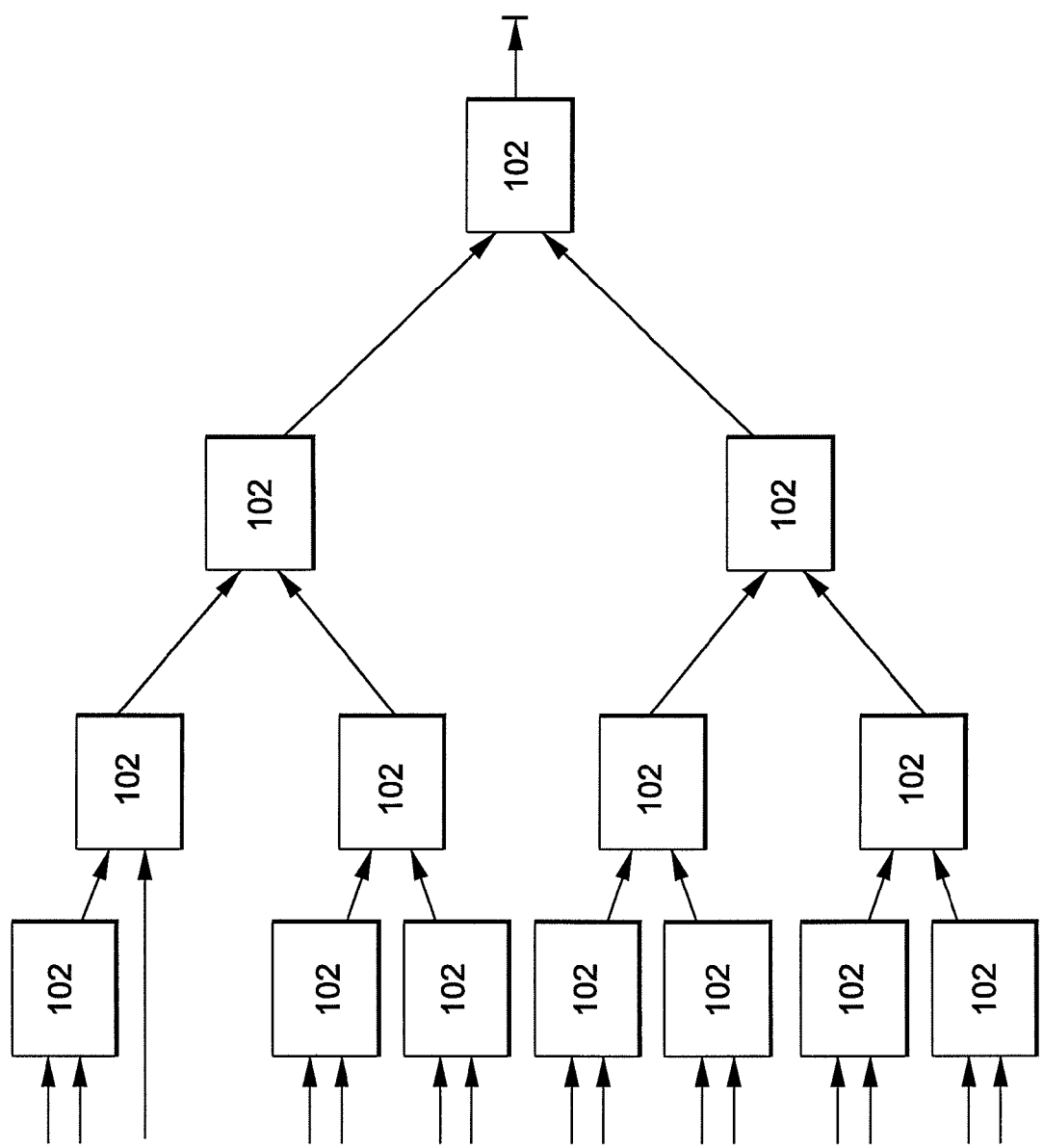
FIG. 10B is an example of a schematic diagram of a seventeen beam combiner, in accordance with an aspect of the subject technology.
Figure 10C:
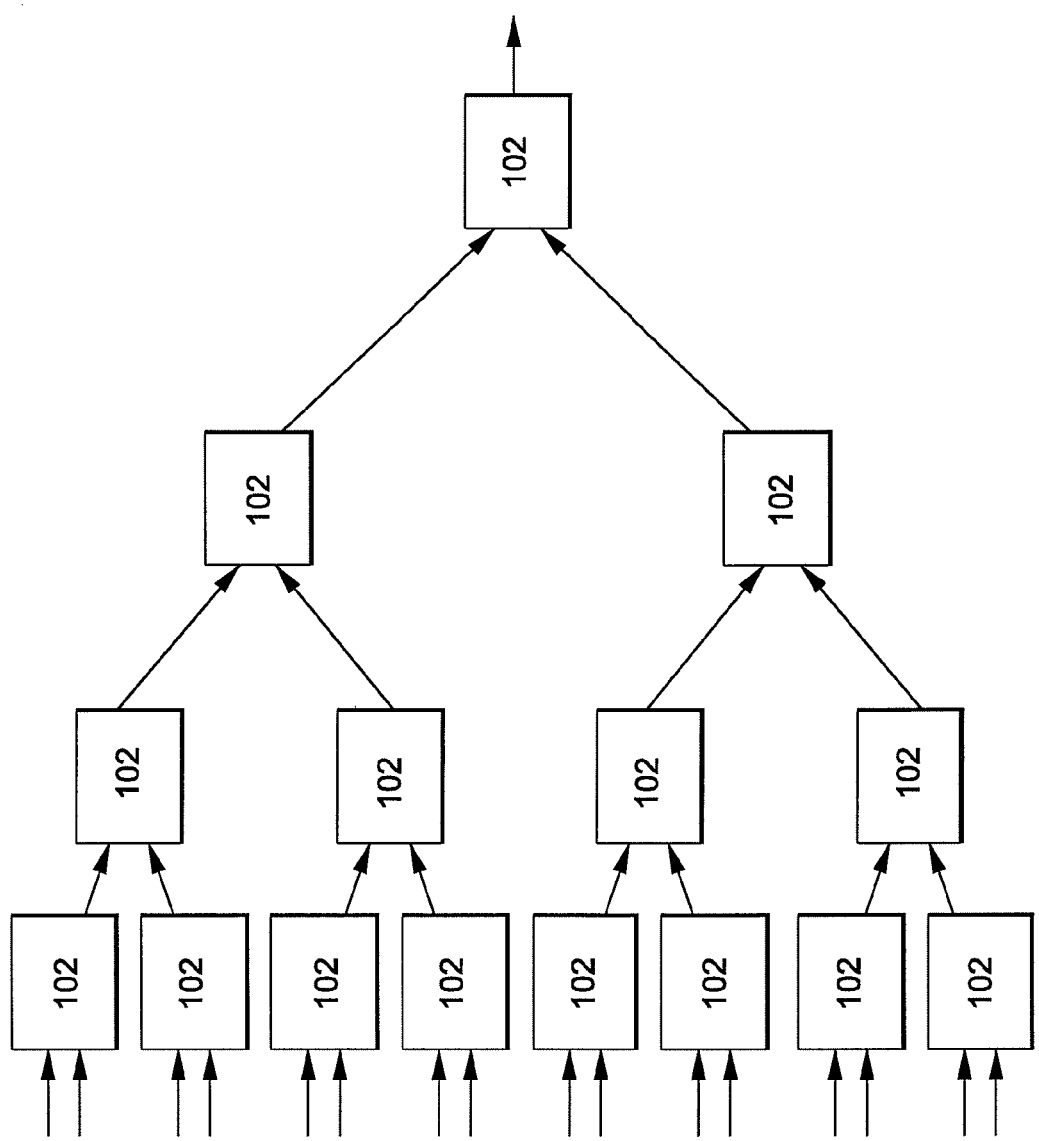
FIG. 10C is an example of a schematic diagram of a sixteen beam combiner, in accordance with an aspect of the subject technology.

FIGS. 10A through 10C illustrate certain, non-limiting examples of Coherent Polarization Beam Combining for different numbers of input beams. The embodiments set forth in FIGS. 10A through 10C are merely examples, however, as any arbitrary positive integer of two or more beams may be combined. FIG. 10A is an example of a schematic of a 13 beam CPBC with phase and polarization modules 101 and polarizing beam combiners (PBC) 102, in accordance with an embodiment of the subject technology. As shown in FIG. 10, multiple laser beams of 2 kilowatts each are combined at PBCs 102 after the pairs of beams being made orthogonal at each PBC and phase-locked in relation to each other by phase and polarization modules 101 to produce a total output laser at point III of greater than 25 kilowatts. Notably, the number of input laser sources is 13, a number that is not the result of the function $2^N$, where N is any arbitrary positive integer exponent. In various embodiments, the subject technology may thus have an arbitrary number of input laser sources. Further, these laser sources may have arbitrary power imbalances in relation to each other. Notably, phase and polarization modules 101 may be mechanically rotated half-wave plates, electrically addressable polarization rotators, or other devices capable of providing phase and polarization control.

FIG. 10B is an example of a schematic diagram of a fifteen beam combiner, in accordance with an aspect of the subject technology. As shown in FIG. 10B, each polarization, phase, and beam combiner unit 102 receives two input laser beams that are polarized to be orthogonal in relation to each other, are phase-locked in relation to each other, and are then combined. This same process is followed in cascading fashion from fifteen input beams, to eight input beams, to four input beams, and finally to two input beams. In this example, a total of fifteen total input beams have been combined.

FIG. 10C is an example of a schematic diagram of a sixteen beam combiner, in accordance with an aspect of the subject technology where the number of input beams is a result of the function $2^N$, where N is any arbitrary positive integer exponent ($2^4$=16). As shown in FIG. 10C, each polarization, phase, and beam combiner unit 102 receives two input laser beams that are polarized to be orthogonal in relation to each other, are phase-locked in relation to each other, and are then combined. This same process is followed in cascading fashion from sixteen input beams, to eight input beams, to four input beams, and to a final two input beams. In this example, a total of sixteen total input beams have been combined.

Figures 11A, 11B:
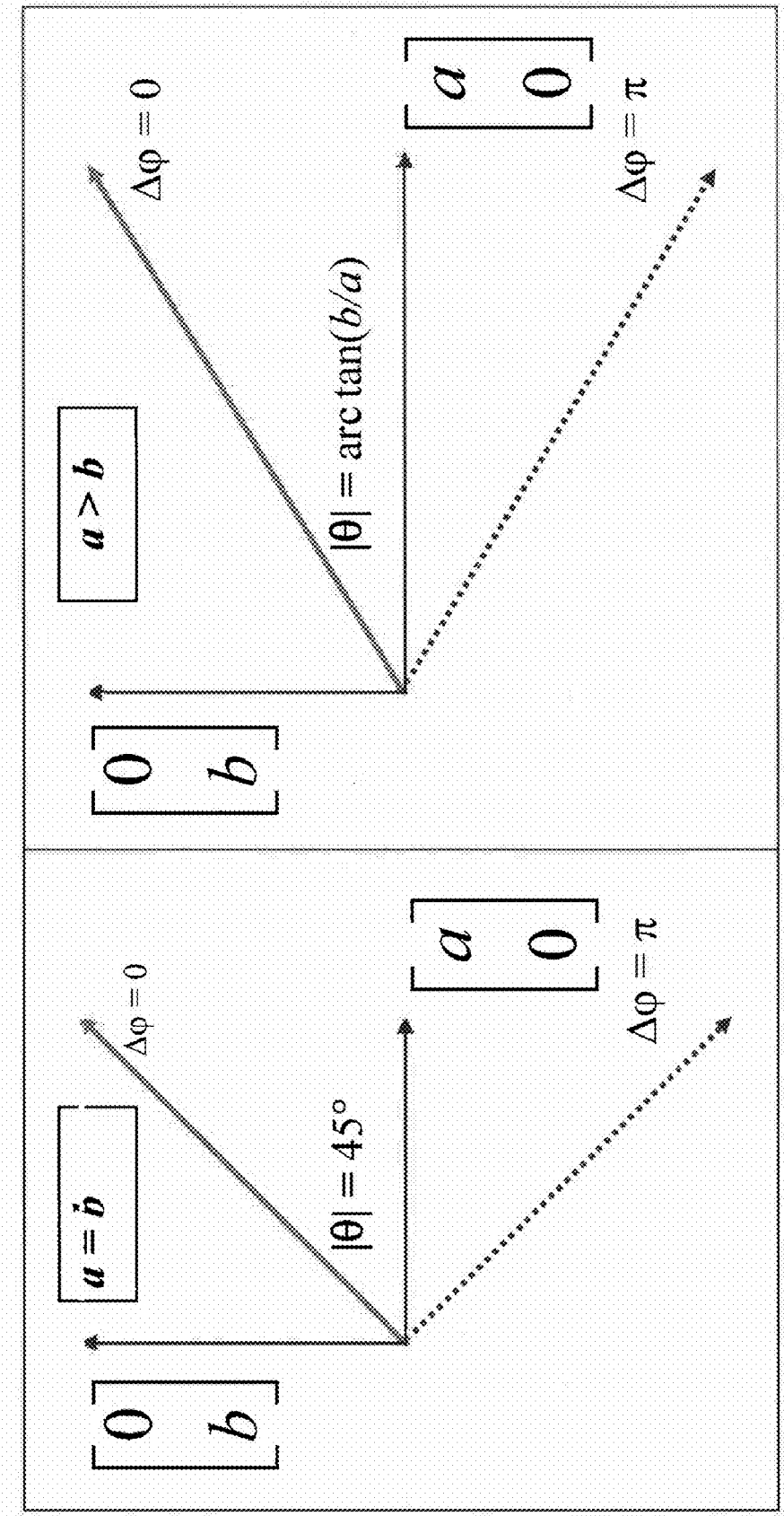
FIG. 11A is an example of a Jones vector representation of a coherent superposition of two orthogonal polarized beams where the beams are of equal power.
FIG. 11B is an example of a Jones vector representation of a coherent superposition of two orthogonal polarized beams where the beams are of unequal power.

FIG. 11A is an example of a Jones vector representation of a coherent superposition of two orthogonal polarized beams where the beams are of equal power, in accordance with an embodiment of the subject technology.

FIG. 11B is an example of a Jones vector representation of a coherent superposition of two orthogonal polarized beams where the beams are of unequal power, in accordance with an embodiment of the subject technology.

Figure 12:
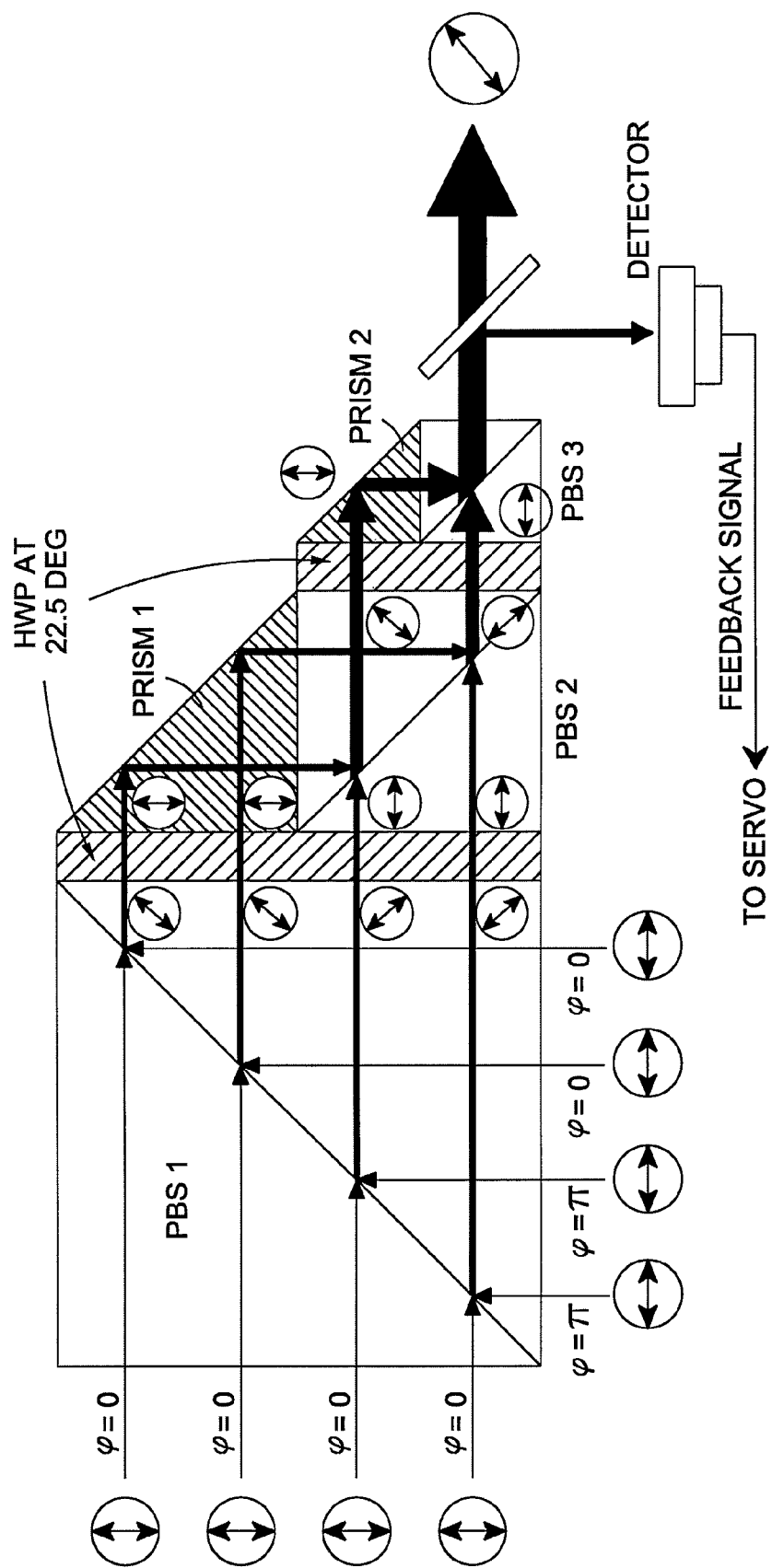
FIG. 12 is an example of a schematic diagram of a monolithic eight beam combiner, in accordance with an aspect of the subject technology.

FIG. 12 is an example of a schematic diagram of an 8 beam CPBC monolithic assembly, in accordance with an embodiment of the subject technology. The monolithic assembly in FIG. 12 incorporates a number of PBC elements, prisms and wave plates that are both optically coupled and physically connected (e.g., in direct physical contact with adjacent optical components, such as may be fabricated using known chemical deposition and planar techniques, and/or optical bonding techniques) to eliminate glass-air interfaces and to thus maximize the power damage threshold.

Figure 13:
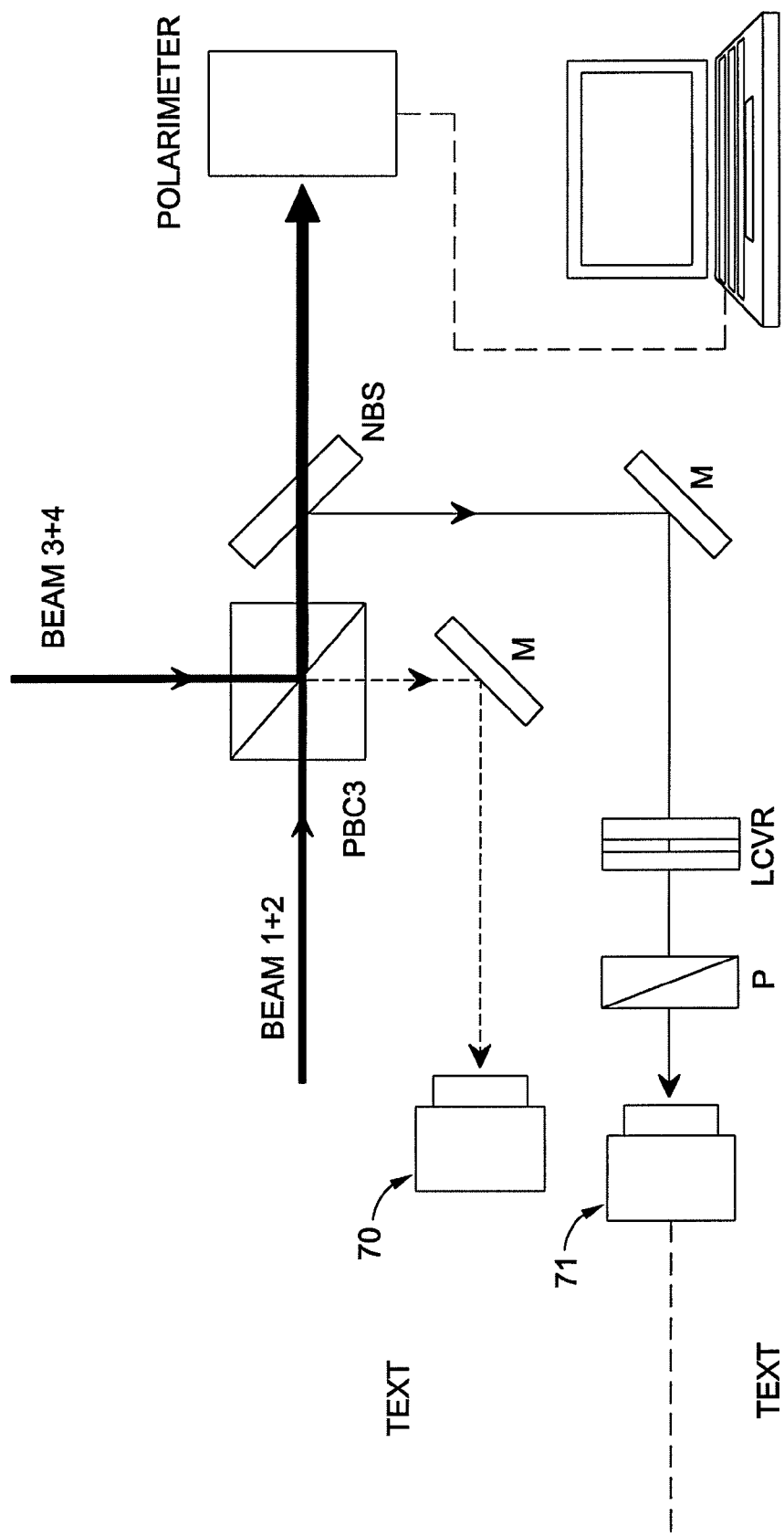
FIG. 13 is an example of a schematic diagram of an aspect of the subject technology where feedback is provided by a non-polarizing beam splitter.

FIG. 13 is an example of a schematic diagram of an embodiment of the subject technology where feedback is provided by a non-polarizing beam splitter NBS to a detector 71. In certain embodiments, FIG. 13 may be viewed as a sub-schematic to FIGS. 6, 8 and/or 9. As shown in FIG. 13, a liquid crystal variable retarder (LCVR) is located in front of servo polarizer P in the feedback beam path, with its slow axis oriented at 45° to the polarizer axis. By applying a series of voltages (a 2 kHz square-wave) to the LCVR, a varied optical retardation was produced between the servo beam's orthogonal polarization components. With the 0 V rms to 10 V rms voltage range available, over a half-wave of retardance control was achieved. In response to the varying polarization of the feedback beam, a servo control device (such as a programmable logic controller, not shown) manipulated the relative phase difference ($\Delta\phi$) between the input beams at PBC 3. This, in turn, changed the polarization state of the final combined beam at the output of PBC 3. To test the lab set up, the output of the beam combiner was sampled with a liquid crystal Stokes polarimeter. For each voltage setting on the LCVR, the polarimeter recorded the Stokes vector of the output beam and the corresponding polarization ellipse.

Figure 14:
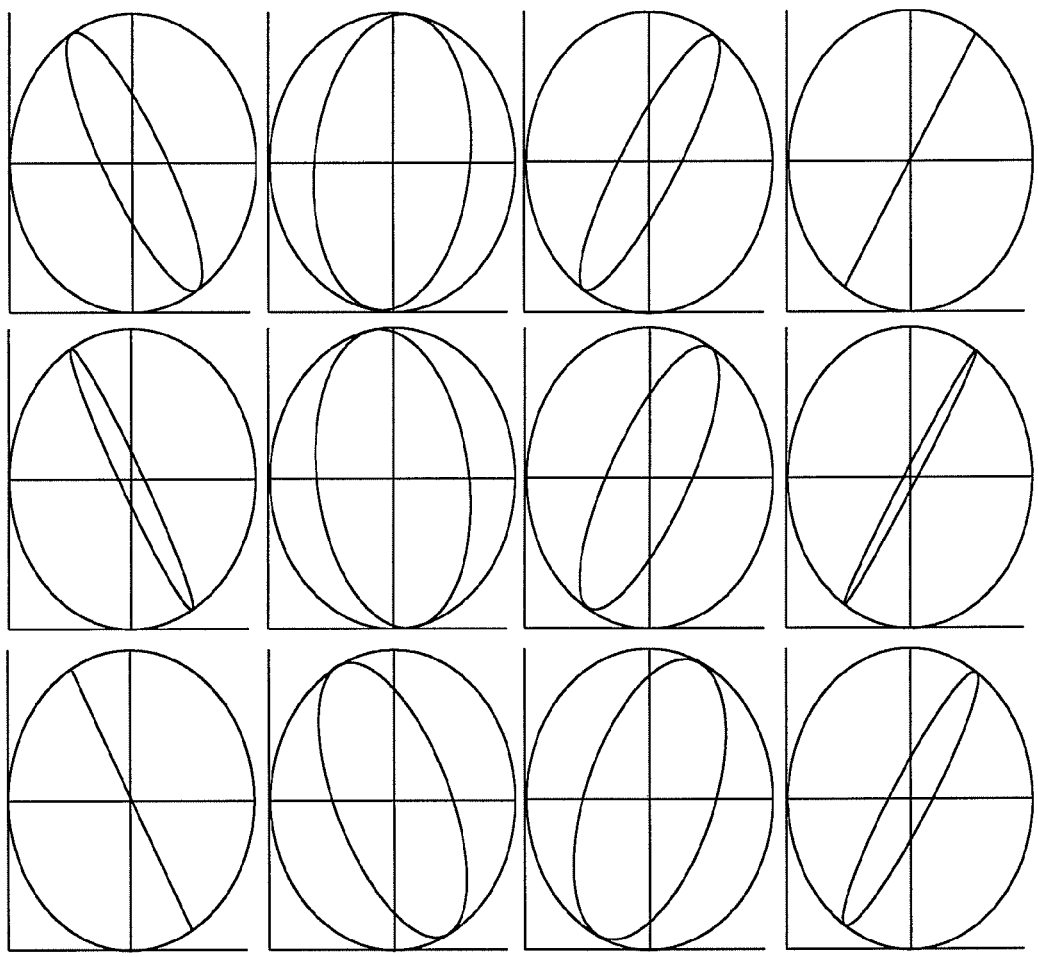
FIG. 14 is an example illustrating polarization states generated in accordance with an aspect of the subject technology.

FIG. 14 is an illustrative example of polarization states generated with an embodiment of the subject technology where the combined output beam's polarization is controlled using feedback provided by a non-polarized beam splitter. Several polarization states, with varying ellipticity and azimuth angles, as created using the methods described in relation to FIG. 13, are shown in FIG. 14 in accordance with aspects of the subject technology.

Figure 15:
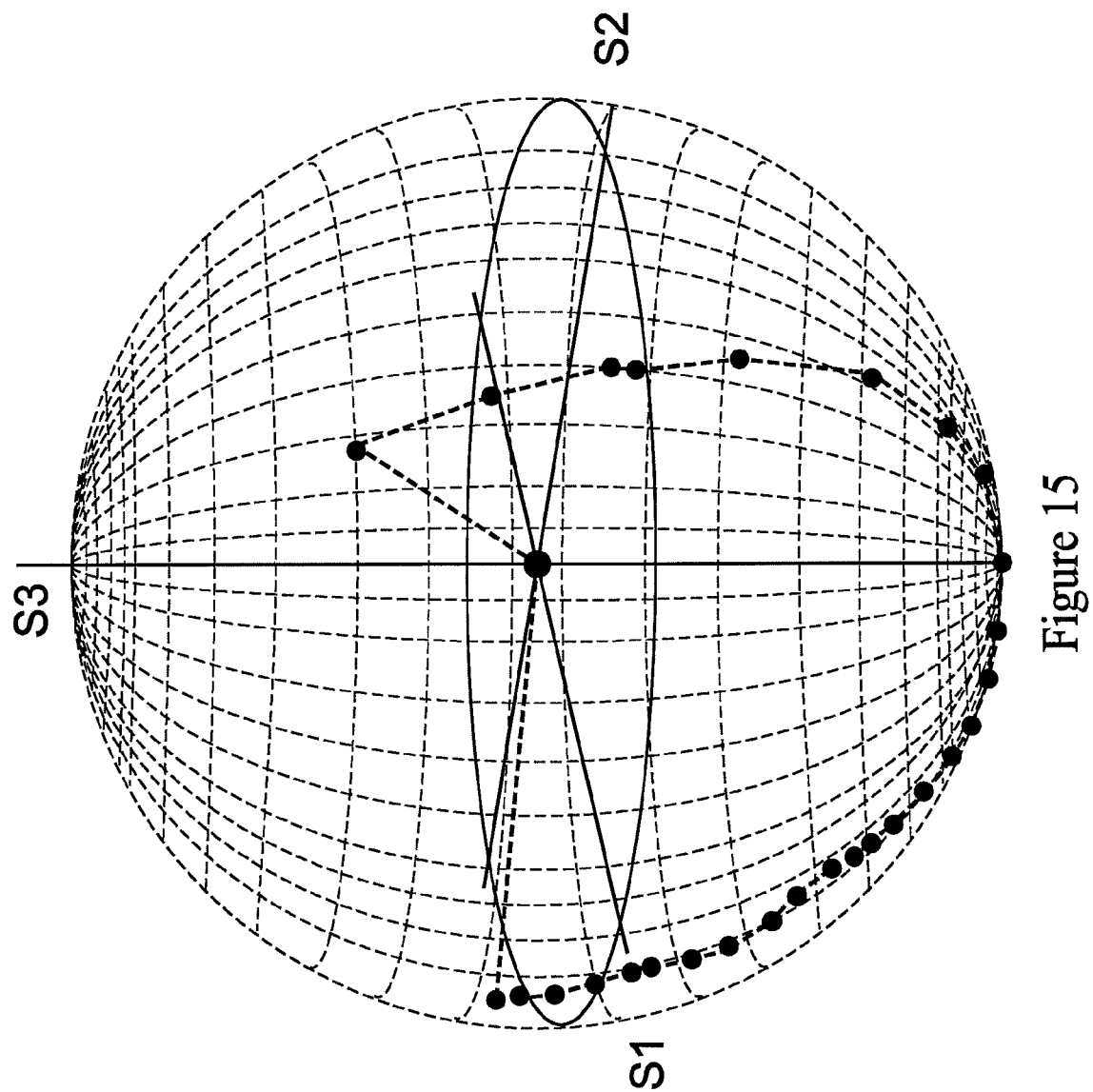
FIG. 15 is an example illustrating a trajectory on a Poincare sphere representing attained polarization of a combined beam, in accordance with an aspect of the subject technology.

FIG. 15 is an illustration of a trajectory on a Poincare sphere representing an attained polarization of the combined beam, in accordance with an aspect of the subject technology. FIG. 15 illustrates the plurality of attainable polarization states of the combined beam output in accordance with an aspect of the subject technology.

Figure 16:
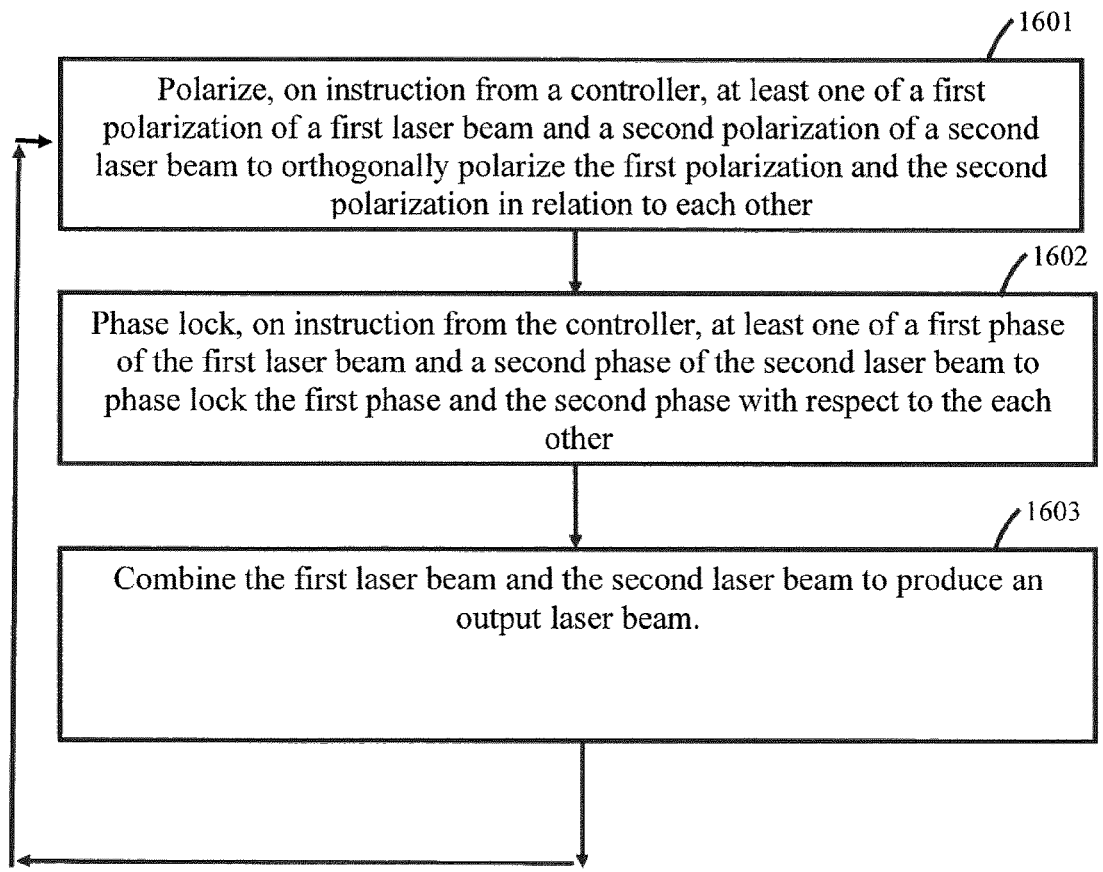
FIG. 16 is an example of a flow diagram that illustrates a method for combining laser beams, in accordance with an aspect of the subject technology.

FIG. 16 is an example of a flow diagram that illustrates a method for CPBC laser beam combining using electronically controlled polarization rotators, in accordance with an embodiment of the subject technology. As shown in FIG. 16, at operation 1601 and on instruction from a controller, at least one of a first polarization of a first laser beam and a second polarization of a second laser beam are polarized to orthogonally polarize the first polarization and the second polarization in relation to each other. At operation 1602 and on instruction from the controller, at least one of a first phase of the first laser beam and a second phase of the second laser beam are phase locked with respect to the each other. At operation 1603, the first laser beam and the second laser beam are combined to create an output laser beam. As shown by the feedback arrow from operation 1603 to operation 1601, if subsequent beams are to be further combined (to include the previously combined beam(s)), then polarization and phase control are repeated for each subsequent beam combining stage. Notably, polarization and phase control are performed at each combination stage, to include for the initial input beams, for any additional input beams, and for beams that have previously been combined and are yet to be combined. That is, phase and polarization control is performed at each combination stage, prior to the actual combination.

Figure 17:
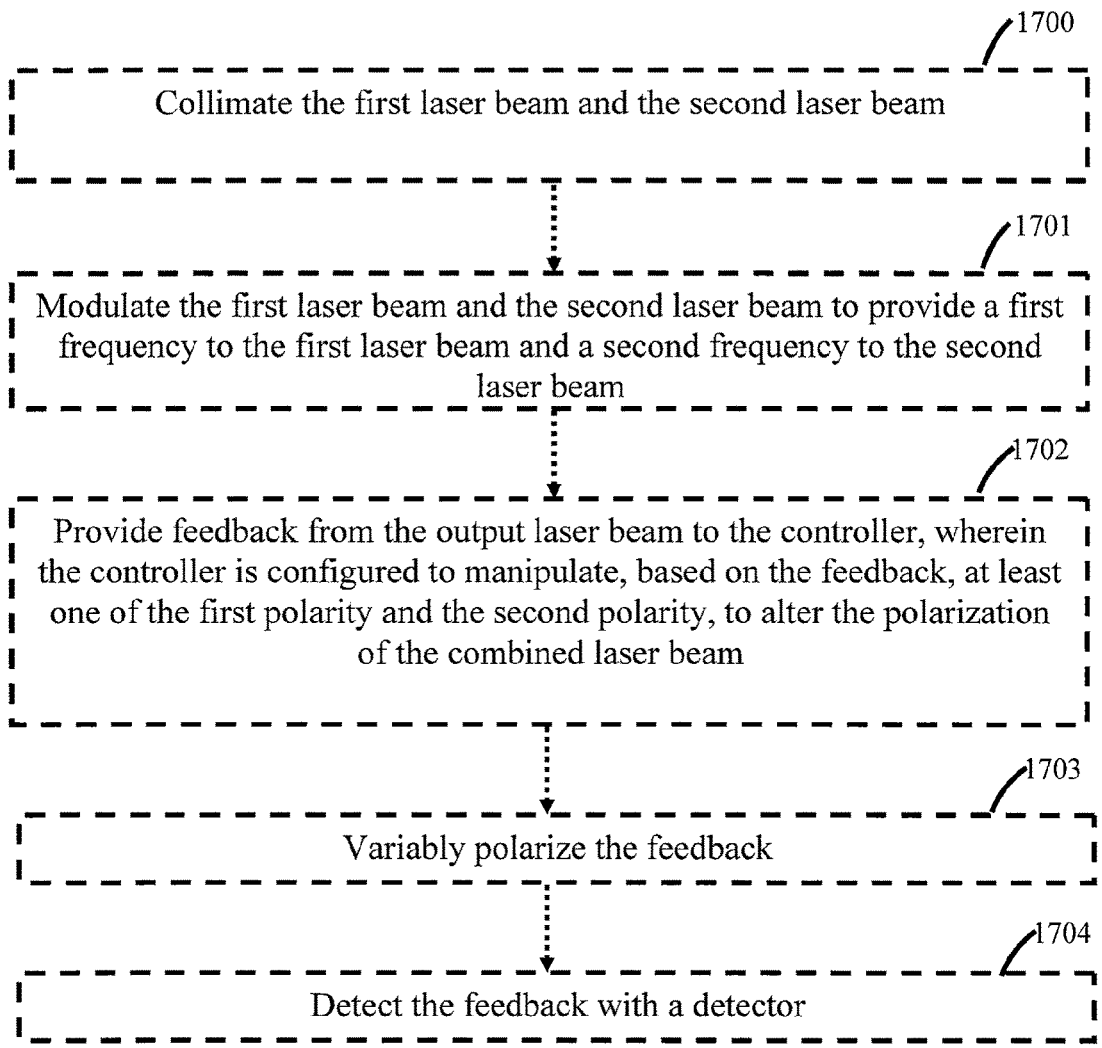
FIG. 17 is an example of a flow diagram that illustrates various alternative steps that may be included in a method for laser beam combining, in accordance with an aspect of the subject technology.

FIG. 17 is an example of a flow diagram that illustrates alternative operations that may be performed in a method for coherent polarization beam combining, in accordance with an embodiment of the subject technology. The operations shown in FIG. 17 are illustrated with dashed boxes and lines to note that they are considered to be alternatives and possible additions to a method for CPBC laser combining, for example, the method illustrated by FIG. 16. The operations illustrated in either of FIGS. 16 and 17 may be re-arranged in various combinations with certain operations coming first and other operations coming last, as one of skill in the art would understand. As shown in FIG. 17, at operation 1700 the first and the second laser beam are collimated. At operation 1701, the first and second laser beams are modulated to provide the first laser beam with a first frequency and the second laser beams with a second frequency. At operation 1702, feedback is provided from the output laser beam to a controller, wherein the controller is configured to manipulate, based on the feedback, at least one of the polarization of the first laser beam and the second laser beam, to alter the polarization of the combined laser beam. At operation 1703, the feedback of operation 1704 is variably polarized. At operation 1704, the feedback is detected with a detector.

Referring back to FIGS. 6, 8, 9, and 10A, according to certain aspects of the disclosure, a controller (e.g., servo controller 72 in FIG. 6) may control various components shown in these figures (e.g., AOM 66, AOM 67, AOM 68, AOM 69, electro-optic modulator array 65, power amplifier 81, power amplifier 82, power amplifier 83, power amplifier 84, any of the half-wave plates including HWP 1, HWP2, HWP3, HWP4, HWPA, HWPB, and/or orientation of polarizers P1, P2, P3, and/or P4). In one aspect of the disclosure, a controller may control each of these components independently. In another aspect of the disclosure, a controller may control some of the components together. In yet another aspect of the disclosure, a controller may comprise a plurality of controllers. In yet a further aspect of the disclosure, any electro-optical modulator array (such as shown in FIG. 8 and as shown in FIG. 6 as element 65) may be replaced with separate electro-optical modulator components, one for each laser beam.

Still referring to FIGS. 6, 8, 9, and 10A, in one aspect of the disclosure, a beam may travel in an optical path (which may be sometimes referred to as an optical path), and the beam may be identified using the same name as it travels through different components. For example, in FIG. 6, a beam may travel in an optical path from EOM array 65, to AOM 66, to C4, and to PBC 2. This beam may be identified as a first laser beam (or a second laser beam, or another name), and it may maintain its name (e.g., first laser beam) as it travels through different components (e.g., EOM array 65, to AOM 66, to C4, and to PBC 2). In another example, a beam may travel in an optical path from PBC 2, to M1, to HWP1, and to PBC 3. This beam may be identified as a second laser beam (or a first laser beam or another name). The beam may maintain its name (e.g., second laser beam) as it travels through different components. In yet another example, in FIG. 9, a beam may travel in an optical path from EOM array 65, to AOM 69, to power amplifier 84, to C1, to HWP4, to P4, and to PBC 1. This beam may be identified as a third laser beam (or a first laser beam, a second laser beam, a fourth laser beam, or another name). The beam may maintain its name as it travels through different components (e.g., EOM array 65, to AOM 69, to power amplifier 84, to C1, to HWP4, to P4, and to PBC 1).

The embodiments described herein may have various alternative embodiments, or alternative structures to accomplish a phase lock and orthogonality between beams. For instance, a Coherent Polarization Beam Combining of an arbitrary number of beams can be accomplished with N–1 polarizing components that may include but are not limited to dielectric polarizing beam splitters/combiners, walk-off polarizers, Wollaston or Rochon polarizers, Brewster angle polarizers and wire-grid polarizers. Further, polarization rotation can be achieved using half-wave plates, polarization rotators made of optically active materials (e.g., quartz), Faraday rotators, or rotators made of a variable retarder followed by a quarter-wave plate.

One factor that may affect the ability to power scale the power of the subject technology is the ability of acquire optics with a sufficient clear aperture. Many suppliers offer polarization components with high damage thresholds ($MW/cm^2$) that could be implemented into a very high power CPBC, capable of delivering powers suitable for directed energy and long range sensing applications.

According to various aspects of the disclosure, the coherent polarization beam combining techniques of the subject technology have many unique advantages in comparison to other beam combining methods. The theoretical combining efficiency of CPBC using the subject technology approaches 100%, and can use off-the-shelf components and accommodate large beam diameters (centimeters or even inches). The polarization state of the output beam is controllable, for instance, by using a polarization element in the servo beam, (e.g., outside the optical path of the combined beam, as described above). Further, unlike binary combination techniques that are constrained to a binary cascade of $2^N$ input sources, the CPBC of the subject technology can combine any arbitrary number of sources, and those sources are not required to be power-balanced, or tuned to any specific power values. These, among other reasons, make CPBC an attractive, practical coherent beam combination approach for power scaling of laser devices.

According to various aspects of the disclosure, the following offers additional descriptions on the number of sources, their power imbalance, polarization control, and power scaling.

Number of Sources and Their Power Imbalance

In certain embodiments, two linearly polarized beams incident on a PBC may form a new polarization state when their polarizations are orthogonal and their phases are well-defined, as described above. The output polarization state may be determined by the relative lengths of the Jones vectors representing these two components (and thus their power imbalance) and the relative phase difference ($\Delta\phi$) between the two beams. Power-balanced beams, polarized at 0° and 90°, can combine into a new beam whose ellipticity depends on the phase difference ($\Delta\phi$). According to some aspects of the subject technology, the two values of phase difference ($\Delta\phi$) that result in linear output polarizations, at +45° and −45°, respectively, are $\Delta\phi=0$ and $\Delta\phi=\pi$ radians. Two pairs of power-balanced, orthogonally linearly polarized beams can thus produce two new orthogonally polarized beams at ±45° that are suitable for a next-stage combination, for example, as shown in, and described in relation to, FIG. 11A.

However, if the beams are not power-balanced, the polarization vector of the output beam will be pointing in different directions than ±45°, as illustrated in FIG. 11B. Any linear polarization state, whether from power-balanced or imbalanced sources, can be accommodated for by the subject technology's CPBC by rotating a respective polarization to one of the optical axes of a PBC. With the appropriate polarization manipulation of the input beams, the combination is theoretically lossless, provided (as in all coherent beam combination techniques) the two beams have identical spatial field distributions.

Power-balanced sources are, in general, difficult to obtain. Typically, to balance multiple sources, the optical power needs to be attenuated to match the weakest source. The subject technology's approach may alleviate this problem by allowing a combination of any number of sources with arbitrary optical powers. The wave plate adjustment technique described in relation to FIG. 9 can be also used to actively compensate for power drift in laser devices and to minimize the negative impact of failure of one or more input sources. Such a "graceful degradation" of the device was demonstrated by blocking one of the four beams and recovering the high combining efficiency (96%) through re-adjusting the orientation of a respective HWP on the beam whose polarization was orthogonal to the polarization of the blocked beam.

Polarization Control

In certain embodiments, for example, as described in relation to FIGS. 6, 8, 9, and/or 13, the controller (for example, controller 72) can control the phases of the source beams through manipulation of either of an AOM or EOM in order to maximize the brightness impinging at the detector as seen at the dark port of a PBC. To achieve a phase-lock between the two beams combined at the final stage of combination (PBC 3), a polarizer may be placed in the servo beam path (e.g., anywhere between the laser source and the PBC). In essence, each PBC, together with phase control, may act as a variable optical retarder. The maximum brightness at the bright port may be achieved when the relative phase difference ($\Delta\phi$) between the two input beams at PBC 3 results in linear polarization of the output beam.

Additional polarization optics, such as a linear optical retarder, can also be inserted in front of the polarizer in the feedback beam path (e.g., the feedback signal from the NBS to controller 72 shown in FIG. 8 or 9). Such a retarder would modify the polarization of the feedback beam from the initial linear polarization and reduce brightness as detected at the dark port detector 70. To maximize the servo detector signal, the servo controller accommodates by adjusting/manipulating the phases of the input beams at PBC 3, to produce a new polarization state that, when passed through the servo retarder, recovers the initial linear polarization and thus achieves the maximum brightness on the servo detector. As a result, the polarization of the CPBC output may be modified. By inserting a variable retarder in the feedback beam path, for example, an LCVR, the polarization of the combined high power output can be controlled without the presence of any polarization optics in the output beam.

Power Scaling

Of concern for any beam combination method is the ability to scale the device to higher powers through more powerful and greater numbers of sources. Because the subject technology can handle a large number of input sources, scaling becomes a matter of designing a high channel count phase-locking servo device, and selecting optics capable of handling the high power requirements of the input sources. The combination of an arbitrary number of sources is a straightforward matter of continuing the cascade of the four beam combination as described in relation to FIGS. 10A through 10C, for example.

With the methods and devices of the subject technology, large diameter beams (of centimeters and even inches) could be used so as long as optics can be acquired with a sufficient clear aperture. Many suppliers offer polarization components with high damage thresholds ($MW/cm^2$) that could be implemented into a high power version of the subject technology, capable of delivering powers suitable for directed energy and long range sensing applications.

A controller, as described herein, may include one or more of a general-purpose processor or specific-purpose processors for executing instructions and may further include a machine-readable medium (e.g., volatile or non-volatile memory) for storing data and instructions for software programs. The term "processor" may refer to one or more processing devices, one or more processors, and/or one or more components thereof. For example, a processor may refer, without limitation, to an aspect of EOM array 65, AOMs 66 through 69, and/or controller 72. A processor may be an integrated circuit or a computer system.

The control aspects of controller 72 may be implemented using software, hardware, or a combination of both. By way of example, any processor discussed herein may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. Software, instructions, and operations, as discussed herein, shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

One of ordinary skill in the art would understand that a machine-readable medium may include any machine-readable media and storage integrated into a processor, such as may be the case with an ASIC. A machine-readable medium may also include any machine-readable media and storage external to a processor, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. A machine-readable medium may include one or more media. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by a processor. Instructions can be, for example, a computer program including code.

The description of the subject technology is provided to enable any person skilled in the art to practice the various configurations described herein. While the disclosure has been particularly described with reference to the various figures and configurations, it should be understood that these are for illustration purposes only and should not be taken as limiting the scope of the subject technology.

There may be many other ways to implement the subject technology. Various functions and elements described herein may be partitioned differently from those shown without departing from the spirit and scope of the subject technology. Various modifications to these configurations will be readily apparent to those skilled in the art, and generic principles defined herein may be applied to other configurations. Thus, many changes and modifications may be made to the subject technology, by one having ordinary skill in the art, without departing from the spirit and scope of the subject technology.

It is understood that the specific order or hierarchy of steps or blocks in the processes disclosed is an illustration of exemplary approaches. Based upon design preferences, it is understood that the specific order or hierarchy of steps or blocks in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A laser beam combining device, comprising:
    a phase and polarization module configured to provide a plurality of laser beams that are phase-locked and pairwise orthogonally polarized, the plurality of laser beams comprising at least a first laser beam and a second laser beam, the first laser beam having a first phase, the second laser beam having a second phase, the first phase and the second phase being phase locked with respect to each other, the first laser beam having a first polarization, the second laser beam having a second polarization, the first polarization being orthogonal to the second polarization;
    a controller configured to control the phase and polarization module to manipulate phase and polarization for each laser beam of the plurality of laser beams;
    a first beam combiner configured to combine the first laser beam and the second laser beam and to provide an output laser beam;
    a dark port detector configured to detect an intensity value output from the first beam combiner;
    a non-polarizing beam splitter configured to receive the output laser beam; and
    a variable polarization component,
    wherein the non-polarizing beam splitter is configured to divert a sample of the output laser beam as feedback to the variable polarization component, the variable polarization component is configured to variably polarize the sample of the output laser beam to provide a feedback input to the controller, and the controller is configured to manipulate, based on the feedback input to the controller, at least one of a first polarity and a second polarity to alter a polarization of the output laser beam, according to a variable polarization of the variable polarization component,
wherein the phase and polarization module comprises:
a first polarizer configured to polarize the first laser beam; and
a second polarizer configured to polarize the second laser beam.

2. The laser beam combining device of claim 1, wherein the first laser beam and the second laser beam have unequal power.

3. The laser beam combining device of claim 1, wherein the phase and polarization module comprises:
a first modulator in an optical path for the first laser beam, the first modulator configured to modulate the first laser beam to a first frequency; and
a second modulator in an optical path for the second laser beam, the second modulator configured to modulate the second laser beam to a second frequency.

4. The laser beam combining device of claim 1, wherein at least one of the first laser beam and the second laser beam has a beam width of at least one of a centimeter to an inch, and an inch or more.

5. The laser beam combining device of claim 1, wherein the variable polarization component is electronically tunable.

6. The laser combining device of claim 1, wherein the phase and polarization module comprises:
a first modulator in an optical path for the first laser beam; and
a second modulator in an optical path for the second laser beam,
wherein the controller is configured to control at least one of the first modulator and the second modulator and configured to provide one or more phase control signals to at least one of the first modulator and the second modulator, and wherein the first modulator and the second modulator are configured to phase lock the first phase and the second phase to each other.

7. The laser beam combining device of claim 1, wherein the phase and polarization module further comprises:
a polarization rotator
wherein the polarization rotator is configured to rotate the first polarizer and the second polarizer to orthogonally polarize the first laser beam and the second laser beam.

8. The laser beam combining device of claim 1, wherein the phase and polarization module further comprises:
a first amplifier in the optical path for the first laser beam, the first amplifier configured to amplify the first laser beam; and
a second amplifier in the optical path for the second laser beam, the second amplifier configured to amplify the second laser beam.

9. The laser beam combining device of claim 1, wherein the first polarizer is a first half-wave plate, and the second polarizer is a second half-wave plate, and
wherein the phase and polarization module further comprises:
a first clean-up polarizer in the optical path for the first laser beam; and
a second clean-up polarizer in the optical path for the second laser beam.

10. The laser combining device of claim 1, comprising:
a second beam combiner configured to combine the output laser beam and a fifth laser beam and to provide a second output laser beam.

11. The laser beam combining device of claim 10, wherein the phase and polarization module comprises:
a third modulator in an optical path for a third laser beam;
a fourth modulator in an optical path for a fourth laser beam; and
wherein the laser beam combining device further comprises a third beam combiner configured to combine the third laser beam and the fourth laser beam and to provide the fifth laser beam,
wherein the controller is configured to control at least one of the third modulator and the fourth modulator and configured to provide one or more phase control signals to at least one of the third modulator and the fourth modulator, and wherein the third modulator and the fourth modulator are configured to phase lock a phase of the third laser beam to a phase of the fourth laser beam.

12. The laser beam combining device of claim 11, wherein the phase and polarization module further comprises:
a third polarizer configured to polarize the third laser beam;
a fourth polarizer configured to polarize the fourth laser beam,
wherein the third polarizer and the fourth polarizer are configured to orthogonally polarize the third laser beam and the fourth laser beam.

13. The laser beam combining device of claim 12, further comprising:
a detector configured to receive at least a portion of the second output laser beam and to provide a feedback signal to the controller based on the at least portion of the second output laser beam;
a dark port detector configured to detect an intensity value output from the second beam combiner;
a first polarization rotator in an optical path for the second output laser beam; and
a second polarization rotator in an optical path for the fifth laser beam.

14. The laser beam combining device of claim 1, wherein the phase and polarization module is configured to receive an odd number of input laser beams.

15. The laser beam combining device of claim 1, wherein the phase and polarization module comprises:
a first modulator in an optical path for a third laser beam;
a first power amplifier in the optical path for the third laser beam;
a third polarizer in the optical path for the third laser beam;
a first polarization rotator in the optical path for the third laser beam;
a second modulator in an optical path for a fourth laser beam;
a second power amplifier in the optical path for the fourth laser beam;
a fourth polarizer in the optical path for the fourth laser beam;
a second polarization rotator in the optical path for the fourth laser beam;
a third modulator in an optical path for a fifth laser beam;
a third power amplifier in the optical path for the fifth laser beam;
a fifth polarizer in the optical path for the fifth laser beam;
a third polarization rotator in the optical path for the fifth laser beam;
a fourth modulator in an optical path for a sixth laser beam;
a fourth power amplifier in the optical path for the sixth laser beam;

a sixth polarizer in the optical path for the sixth laser beam;
a fourth polarization rotator in the optical path for the sixth laser beam;
a second beam combiner configured to combine the third laser beam and the fourth laser beam and to provide the first laser beam;
a third beam combiner configured to combine the fifth laser beam and the sixth laser beam and to provide the second laser beam; and
a detector configured to receive at least a portion of the output laser beam and to provide a feedback signal to the controller based on the at least portion of the output laser beam,
wherein the controller is configured to control the first modulator independently of the second modulator.

16. A laser beam combining device, comprising:
a first modulator in an optical path for a first laser beam;
a first polarizer in the optical path for the first laser beam;
a second modulator in an optical path for a second laser beam;
a second polarizer in the optical path for the second laser beam;
a third modulator in an optical path for a third laser beam;
a third polarizer in the optical path for the third laser beam;
a fourth modulator in an optical path for a fourth laser beam;
a fourth polarizer in the optical path for the fourth laser beam;
a first beam combiner configured to combine the first laser beam and the second laser beam and to provide a first output laser beam;
a second beam combiner configured to combine the third laser beam and the fourth laser beam and to provide a second output laser beam;
a third beam combiner configured to combine the first output laser beam and the second output laser beam and to provide a third output laser beam; and
a controller configured to control the first modulator, the second modulator, the third modulator, and the fourth modulator,
wherein the first modulator and the second modulator are configured to phase lock a phase of the first laser beam to a phase of the second laser beam, the third modulator and the fourth modulator are configured to phase lock a phase of the third laser beam to a phase of the fourth laser beam, the first polarizer and the second polarizer are configured to orthogonally polarize the first laser beam and the second laser beam, and the third polarizer and the fourth polarizer are configured to orthogonally polarize the third laser beam and the fourth laser beam.

17. A laser beam combining device, comprising:
a phase and polarization module configured to provide a plurality of laser beams that are phase-locked and pair-wise orthogonally polarized, the plurality of laser beams comprising at least a first laser beam and a second laser beam, the first laser beam having a first phase, the second laser beam having a second phase, the first phase and the second phase being phase locked with respect to each other, the first laser beam having a first polarization, the second laser beam having a second polarization, the first polarization being orthogonal to the second polarization;
a controller configured to control the phase and polarization module to manipulate phase and polarization for each laser beam of the plurality of laser beams;
a first beam combiner configured to combine the first laser beam and the second laser beam and to provide an output laser beam; and
a dark port detector configured to detect an intensity value output from the first beam combiner,
wherein the phase and polarization module comprises:
a first modulator in an optical path for the first laser beam;
a second modulator in an optical path for the second laser beam;
a polarization rotator;
a first polarizer in the optical path for the first laser beam; and
a second polarizer in the optical path for the second laser beam,
wherein the polarization rotator is configured to rotate the first polarizer and the second polarizer to orthogonally polarize the first laser beam and the second laser beam,
wherein the controller is configured to control at least one of the first modulator and the second modulator and configured to provide one or more phase control signals to at least one of the first modulator and the second modulator, and wherein the first modulator and the second modulator are configured to phase lock the first phase and the second phase to each other.

18. A method of combining a plurality of laser beams, comprising:
modulating a first laser beam using a first modulator;
modulating a second laser beam using a second modulator;
modulating a third laser beam using a third modulator;
modulating a fourth laser beam using a fourth modulator;
controlling the first modulator using a controller;
controlling the second modulator using the controller;
controlling the third modulator using the controller;
controlling the fourth modulator using the controller;
orthogonally polarizing the first laser beam and the second laser beam;
orthogonally polarizing the third laser beam and the fourth laser beam;
phase locking a phase of the first laser beam to a phase of the second laser beam using the first and second modulators;
phase locking a phase of the third laser beam to a phase of the fourth laser beam using the third and fourth modulators;
combining the first laser beam and the second laser beam using a first beam combiner;
providing a first output laser beam;
combining the third laser beam and the fourth laser beam using a second beam combiner;
providing a second output laser beam;
combining the first output laser beam and the second output laser beam using a third beam combiner; and
providing a third output laser beam.

* * * * *